(12) United States Patent
Nishimura

(10) Patent No.: US 9,899,360 B2
(45) Date of Patent: Feb. 20, 2018

(54) SEMICONDUCTOR DEVICE

(71) Applicant: ROHM CO., LTD., Kyoto-shi, Kyoto (JP)

(72) Inventor: Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/943,103

(22) Filed: Nov. 17, 2015

(65) Prior Publication Data

US 2016/0148919 A1 May 26, 2016

(30) Foreign Application Priority Data

Nov. 26, 2014 (JP) .................................. 2014-238584

(51) Int. Cl.
| | |
|---|---|
| H01L 25/18 | (2006.01) |
| H01L 23/552 | (2006.01) |
| H01L 23/66 | (2006.01) |
| H01L 25/065 | (2006.01) |
| H01L 23/498 | (2006.01) |
| H01L 23/24 | (2006.01) |
| H01L 23/31 | (2006.01) |
| H01L 23/13 | (2006.01) |
| H01L 23/14 | (2006.01) |

(52) U.S. Cl.
CPC .............. *H01L 25/18* (2013.01); *H01L 23/13* (2013.01); *H01L 23/147* (2013.01); *H01L 23/24* (2013.01); *H01L 23/3135* (2013.01); *H01L 23/49811* (2013.01); *H01L 23/552* (2013.01); *H01L 23/66* (2013.01); *H01L 25/0657* (2013.01); *H01L 2224/16225* (2013.01); *H01L 2924/0002* (2013.01); *H01L 2924/15156* (2013.01); *H01L 2924/181* (2013.01)

(58) Field of Classification Search
CPC ..... H01L 25/18; H01L 23/528; H01L 23/481; H01L 23/3142; H01L 23/552; H01L 23/66; H01L 25/0657; H01L 23/13; H01L 23/147; H01L 23/49811
See application file for complete search history.

(56) References Cited

U.S. PATENT DOCUMENTS

| 8,415,811 B2 | 4/2013 | Fukumura et al. | |
|---|---|---|---|
| 2009/0065919 A1* | 3/2009 | Jang | H01L 23/13 |
| | | | 257/686 |
| 2012/0104623 A1* | 5/2012 | Pagaila | H01L 23/13 |
| | | | 257/774 |

FOREIGN PATENT DOCUMENTS

JP  2012-99673 A  5/2012

* cited by examiner

*Primary Examiner* — Ermias Woldegeorgis
(74) *Attorney, Agent, or Firm* — Hamre, Schumann, Mueller & Larson, P.C.

(57) ABSTRACT

A semiconductor device includes a semiconductor substrate, a conducting portion, and a sealing resin. The substrate has a main surface and is formed with a recessed portion in the main surface. The conducting portion is formed on the substrate. The sealing resin is disposed in the recessed portion. The conducting portion includes a first wiring layer and a second wiring layer both formed in the recessed portion. The second wiring layer is closer to the main surface than is the first wiring layer in the normal direction of the main surface.

19 Claims, 28 Drawing Sheets

SEMICONDUCTOR DEVICE

BACKGROUND OF THE INVENTION

1. Field of the Invention

The present invention relates to a semiconductor device.

2. Description of Related Art

Various types of semiconductor devices for carrying out specific functions in response to input/output of current from an external source have been proposed (e.g., see JP 2012-99673A). In general, multiple elements that each constitute part of an electrical circuit are provided in order to carry out the function of the semiconductor device. Metal leads are used for the purpose of supporting these elements and connecting them to each other. The number, shape, and size of the leads are determined in accordance with the function, shape, and size of the multiple elements. The multiple elements mounted on the leads are covered with sealing resin. Sealing resin is for protecting the elements and a portion of the leads. This kind of semiconductor device is used by being mounted on a circuit board of an electronic device, for example.

The leads are often formed through a punching process using a mold, for example. The method in which the mold is used is advantageous in that the leads can be formed efficiently and accurately. However, the leads commonly differ in number, size, and shape, depending on the multiple elements. For this reason, if the function required of the semiconductor device or the like is changed, the size and shape of the leads need to be changed. In order to realize this, it is required that the mold is remade. The mold is relatively expensive, and therefore in the case where a small number of the semiconductor devices are produced, the cost of the semiconductor devices is increased.

Also, since the leads are obtained by machining a metal plate, the leads commonly have a flat shape. Although it is possible to optionally carry out drawing to give the leads a three-dimensional shape, certain constraints are imposed. Year after year, semiconductor devices are required to have improved functions and more functions. In order to meet such demand, it is required that the multiple elements are mounted with higher accuracy, arranged in three dimensions instead of in a flat arrangement, or the like.

SUMMARY OF THE INVENTION

The present invention is conceived of in the above-described situation, and aims to provide a semiconductor device by which it is possible to achieve a decrease in manufacturing cost. Also, the present invention aims to provide a semiconductor device by which it is possible to mitigate restrictions on the arrangement of multiple elements and achieve a decrease in size.

A semiconductor device provided by a first aspect of the present invention includes: a semiconductor substrate that has a main surface and a recessed portion formed in the main surface; a conducting portion formed on the substrate; and a sealing resin disposed in the recessed portion. The conducting portion includes a first wiring layer and a second wiring layer both formed in the recessed portion, and the second wiring layer is closer to the main surface than is the first in the normal direction of the main surface.

In a preferred embodiment, the recessed portion has an inclined inner surface inclined with respect to the main surface, and a bottom surface connected to the inclined inner surface. The first wiring layer is formed on the bottom surface.

In a preferred embodiment, the semiconductor device further includes an insulating film covering the bottom surface. The second wiring layer is disposed between the insulating film and the sealing resin.

In a preferred embodiment, the insulating film is formed with a through-hole penetrating in the thickness direction of the insulating film. The conducting portion includes an electroconductive connection route that is formed in the through-hole and connected to both the first wiring layer and the second wiring layer.

In a preferred embodiment, the semiconductor device includes a first circuit element disposed in the recessed portion.

In a preferred embodiment, the first circuit element is supported by the bottom surface.

In a preferred embodiment, the insulating film covers at least a part of the first circuit element.

In a preferred embodiment, the first circuit element includes a first surface facing the bottom surface and a second surface opposite to the first surface, where the second surface is not covered by the insulating film. The second wiring layer spans across the second surface and the insulating film.

In a preferred embodiment, the insulating film includes a flat surface parallel to the bottom surface, and an inclined surface closer to the first circuit element than is the flat surface. The second wiring layer spans across the second surface and the inclined surface.

In a preferred embodiment, the insulating film covers the entirety of the first circuit element.

In a preferred embodiment, the semiconductor device further includes a second circuit element that overlaps with at least a part of the first circuit element as viewed in the normal direction of the main surface.

In a preferred embodiment, the second wiring layer includes a plurality of second element pads for mounting the second circuit element.

In a preferred embodiment, the first circuit element includes a first surface facing the bottom surface and a second surface opposite to the first surface, where the second surface is not covered by the insulating film. The second wiring layer includes a shield layer that covers the entirety of the second surface.

In a preferred embodiment, the insulating film includes a flat surface parallel to the bottom surface, and an inclined surface closer to the first circuit element than is the flat surface. The shield layer spans across the second surface and the inclined surface.

In a preferred embodiment, the conducting portion has a plurality of column-like portions for mounting the second circuit element, and each of the column-like portions has an end portion connected to the second wiring layer and extends in a depth direction of the recessed portion.

In a preferred embodiment, the insulating film covers the entirety of the first circuit element, and the second wiring layer includes a shield layer that is located between the first circuit element and the second circuit element, and that overlaps with the entirety of the first circuit element as viewed in the normal direction of the main surface.

In a preferred embodiment, the conducting portion has a plurality of external terminals formed on the main surface, and the shield layer is connected to one external terminal among the plurality of external terminals that is connected to ground.

In a preferred embodiment, the second circuit element is a wireless communication element.

In a preferred embodiment, the substrate is made of a single-crystal semiconductor material.

In a preferred embodiment, the semiconductor material is Si.

In a preferred embodiment, the main surface is a (100) surface, and the recessed portion has four inclined inner surfaces each inclined with respect to the main surface of the substrate.

Other features and advantages of the present invention will become apparent from the detailed description given below with reference to the accompanying drawings.

DESCRIPTION OF THE PREFERRED EMBODIMENTS

Hereinafter, preferred embodiments of the present invention will be described in detail with reference to the drawings.

Figure 1:
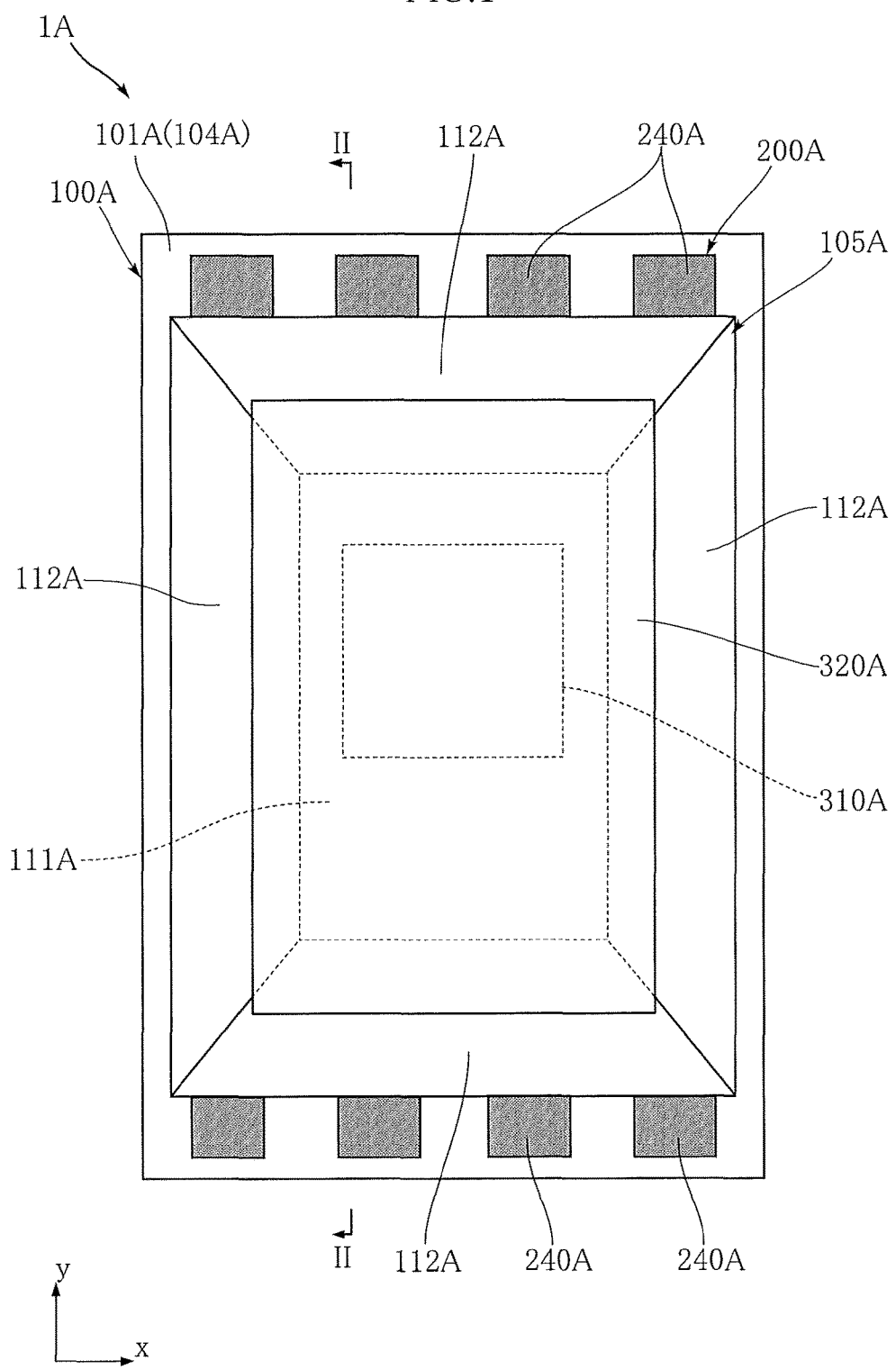
FIG. 1 is a plan view showing relevant parts of a semiconductor device based on a first embodiment of the present invention.
Figure 2:
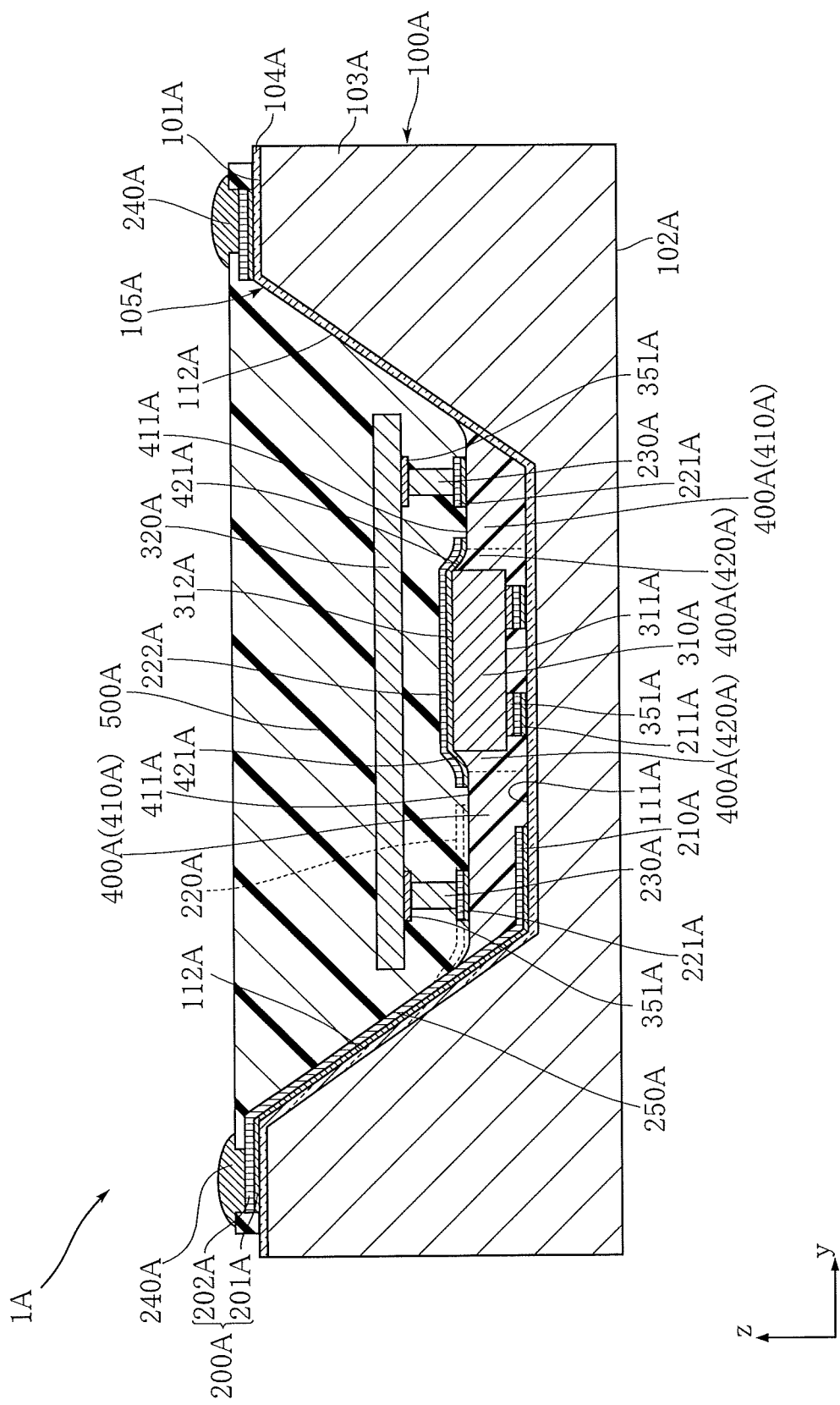
FIG. 2 is a cross-sectional view taken along line II-II in FIG. 1.

FIGS. 1 and 2 show a semiconductor device based on the first embodiment of the present invention. A semiconductor device 1A of the present embodiment includes a substrate 100A, a conducting portion 200A, a first circuit element 310A, a second circuit element 320A, an insulating film 400A, and sealing resin 500A. Note that in FIG. 1, to facilitate understanding, the sealing resin 500A is omitted. FIG. 2 is a cross-section in a yz plane, taken along line II-II in FIG. 1.

The semiconductor device 1A is configured as a wireless communication module according to the configuration described below. As an example of the size of the semiconductor device 1A, the plan-view dimensions are about 1.5 mm×2.5 mm, and the thickness is about 0.6 mm.

The substrate 100A is the base of the semiconductor device 1A, and is composed of a base material 103A and an insulating layer 104A. The substrate 100A has a main surface 101A, a back surface 102A, and a recessed portion 105A. The thickness of the substrate 100A is about 600 μm, for example. Note that in the present embodiment, the main surface 101A and the back surface 102A face mutually opposite sides in the z direction, and the z direction corresponds to the thickness direction of the semiconductor device 1A. Also, the x direction and the y direction are both perpendicular to the z direction.

The base material 103A is made of a single-crystal semiconductor material, and is made of single-crystal Si in the present embodiment. Also, the insulating layer 104A is made of $SiO_2$ in the present embodiment. Note that the material of the base material 103A is not limited to being Si and it is sufficient that the material is such that the recessed portion 105A, which fulfills a later-described purpose, can be formed. The insulating layer 104A covers a portion of the base material 103A facing from the side opposite to the back surface 102A. The thickness of the insulating layer 104A is about 0.1 to 1.0 μm, for example.

Figure 3:
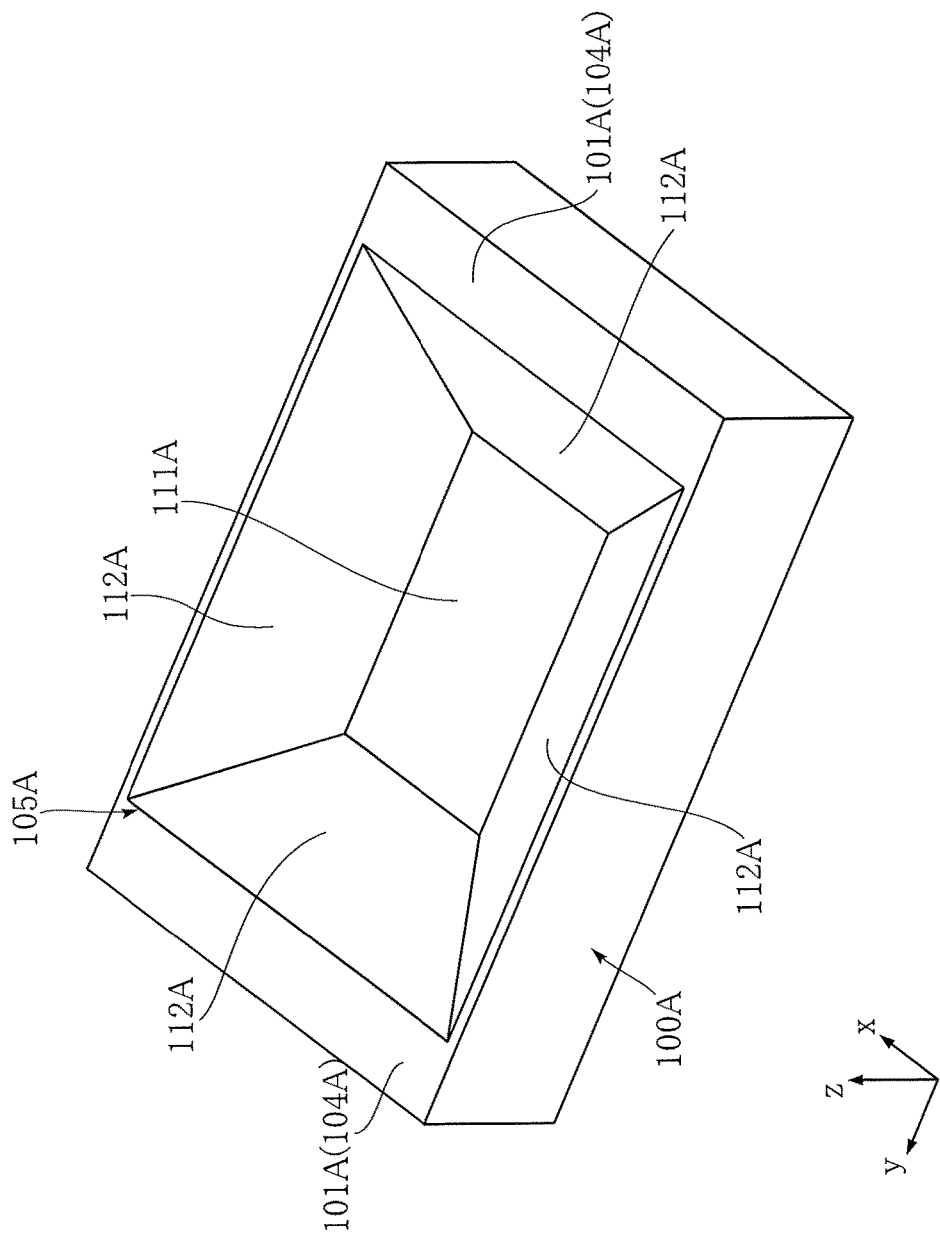
FIG. 3 is a perspective view showing a substrate of the semiconductor device shown in FIG. 1.

FIG. 3 is a perspective view showing the substrate 100A. In the present embodiment, a (100) surface of the base material 103A is used as the main surface 101A. The recessed portion 105A is recessed toward the rear surface 102A from the main surface 101A. In the present embodiment, the recessed portion 105A has a bottom surface 111A and four inclined inner surfaces 112A. The shape of the recessed portion 105A depends on the fact that a (100) surface is used as the main surface 101A.

Due to the recessed portion 105A being formed, the main surface 101A is in the form of a rectangular ring in plan view. More specifically, two sites on the main surface 101A that are located apart from each other in the y direction on opposite sides of the recessed portion 105A are significantly larger than two sites on the main surface 101A that are located apart from each other in the x direction on opposite sides of the recessed portion 105A.

The recessed portion 105A has a rectangular shape in plan view. The depth of the recessed portion 105A is about 440 μm, for example. The bottom surface 111A has a rectangular shape in plan view. In plan view, the four inclined inner surfaces 112A surround the bottom surface 111A and have approximately trapezoidal shapes whose upper bases are in contact with the bottom surface 111A. The inclined inner surfaces 112A are inclined with respect to the bottom surface 111A. In the present embodiment, the angle of inclination with respect to the xy plane of the inclined inner surfaces 112A is about 55°. Note that the fact that the inclined inner surfaces 112A have approximately trapezoidal shapes and the inclination angle thereof is 55° depends on the fact that the (100) surface is used as the main surface 101A.

The conducting portion 200A is for mounting the first circuit element 310A and the second circuit element 320A and forming a current path for performing input to and output from the first circuit element 310A and the second circuit element 320A. The conducting portion 200A is formed mainly on the insulating layer 104A, and has a structure obtained by stacking a barrier seed layer 201A and a plating layer 202A in the present embodiment.

The barrier seed layer 201A is a so-called underlying layer for forming a desired plating layer 202A, and is formed mainly on the insulating layer 104A. The barrier seed layer 201A is composed of a Ti layer serving as, for example, a barrier layer formed on the insulating layer 104A, and a Cu layer serving as a seed layer stacked on the barrier layer. The barrier seed layer 201A is formed through sputtering, for example. In the present embodiment, the barrier seed layer 201A is formed at predetermined sites on the insulating layer 104A, the insulating film 400A, and the first circuit element 310A.

The plating layer 202A is made of Cu, for example, and is formed through electrolytic plating using the barrier seed layer 201A. The thickness of the plating layer 202A is about 5 μm, for example.

In the present embodiment, the conducting portion 200A has a first wiring layer 210A, a second wiring layer 220A, multiple column-like portions 230A, multiple external terminals 240A, and a connection path 250A.

The first wiring layer 210A is formed on the bottom surface 111A and has a predetermined pattern shape. The first wiring layer 210A has multiple bottom surface pads 211A. The multiple bottom surface pads 211A are used to mount the first circuit element 310A.

The second wiring layer 220A is located toward the main surface 101A with respect to the first wiring layer 210A in the normal direction (z direction) of the main surface 101A. The second wiring layer 220A is interposed between the insulating film 400A and the sealing resin 500A and has a predetermined pattern shape. In the present embodiment, the second wiring layer 220A is formed so as to span across an upper surface 312A (surface facing the side opposite to the surface opposing the bottom surface 111A) of the first circuit element 310A and the insulating film 400A (later-described inclined portions 420A) adjacent thereto. The second wiring layer 220A has multiple second element pads 221A and a shield layer 222A. The multiple second element pads 221A are used to mount the second circuit element 320A. The shield layer 222A is interposed between the first circuit element 310A and the second circuit element 320A and covers the entirety of the upper surface 312A of the first circuit element 310A. In the present embodiment, the shield layer 222A is formed so as to span across the upper surface 312A and the inclined portions 420A of the insulating film 400A, which are adjacent thereto. The shield layer 222A is electrically connected to the connection path 250A, which will be described later, and is also electrically connected to the external terminal 240A for the ground terminal.

The column-like portions 230A extend in the depth direction of the recessed portion 105A as shown in FIG. 2. In the present embodiment, the lower ends of the column-like portions 230A are connected to the second element pads 221A (the second wiring layer 220A), and extend inside of the sealing resin 500A. The second circuit element 320A is mounted on the column-like portions 230A via solder 351A. The column-like portions 230A are made of Cu, for example, and are formed through electrolytic plating using the second element pads 221A.

The external terminal 240A is formed on the main surface 101A and is used to surface-mount the semiconductor device 1A on a circuit board of an electronic device (not shown), for example. In the present embodiment, four external terminals 240A are formed at each of the two sites on the main surface 101A arranged apart from each other in the y direction on opposite sides of the recessed portion 105A. Also, the external terminals 240A each have one side in contact with the outer edge of the recessed portion 105A. The external terminals 240A each have a structure in which a bump obtained by further performing non-electrolytic plating with a metal such as Ni, Pd, or Au, for example, on the above-described barrier seed layer 201A and the plating layer 202A is formed. Accordingly, as shown in FIG. 2, the external terminals 240A each have a shape that swells in the z direction.

The connection path 250A is formed on the inclined inner surfaces 112A and constitutes a path that electrically connects the external terminal 240A and the first wiring layer 210A or second wiring layer 220A. Note that the position at which connection path 250A is formed is determined according to the arrangement of the external terminals 240A, the arrangement of the terminals of the first circuit element 310A and the second circuit element 320, and the like. FIG. 2 shows a mode in which the connection path 250A is formed on an inclined inner surface 112A, but does not show the specific forming position. Also, in FIG. 1, the connection path 250A is omitted.

Note that in the present embodiment, the external terminal 240A located second from the left in the upper portion of FIG. 1 is used as a so-called ground terminal. The connection path 250A, which is electrically connected to this external terminal 240A, and the shield layer 222A are connected to ground.

The first circuit element 310A is supported by the bottom surface 111A and is mounted via the solder 351A using the multiple bottom surface pads 211A. The first circuit element 310A is for controlling the second circuit element 320A, and is, for example, an integrated circuit element.

The insulating film 400A is formed on the bottom surface 111A and covers a portion of the first circuit element 310A, and the first wiring layer 210A. The insulating film 400A covers the lower surface 311A (surface opposing the bottom surface 111A) of the first circuit element 310A, whereas it does not cover the upper surface 312A of the first circuit element 310A. The insulating film 400A is configured to include a flat portion 410A and an inclined portion 420A that is adjacent to the first circuit element 310A. The flat portion 410A has a flat surface 411A that is parallel to the bottom surface 111A. The inclined portion 420A has an inclined surface 421A. The inclined surface 421A is inclined so as to be displaced toward the main surface 101A in the normal direction (z direction) of the main surface 101A as the distance between the inclined surface 421A and the first circuit element 310A decreases. Examples of materials constituting the insulating film 400A include polyimide resin, epoxy nitride resin, phenol resin, polybenzoxazole (PBO) resin, and silicone resin. Also, the insulating film 400A may be configured as a silicon oxide film or a silicon nitride film formed through a CVD method.

The second circuit element 320A is an element for near-field wireless data communication conforming to the Bluetooth (registered trademark) standard, and is supported by the insulating film 400A via the multiple column-like portions 230A. The second circuit element 320A is mounted on the column-like portions 230A via the solder 351A.

The sealing resin 500A covers the second wiring layer 220A and the second circuit element 320A and fills the recessed portion 105A. In the present embodiment, the sealing resin 500A covers the entirety of the second wiring layer 220A, which includes the shield layer 222A, and the entirety of the second circuit element 320A. Examples of materials for the sealing resin 500A include epoxy resin, phenol resin, polyimide resin, polybenzoxazole (PBO) resin, and silicone resin. The sealing resin 500A may be either translucent resin or non-translucent resin, but in the present embodiment, non-translucent resin is preferable.

Next, a method for manufacturing the semiconductor device 1A will be described below with reference to FIGS. 4 to 26. Note that the drawings show cross sections in the yz plane, taken along line II-II in FIG. 1.

Figure 4:
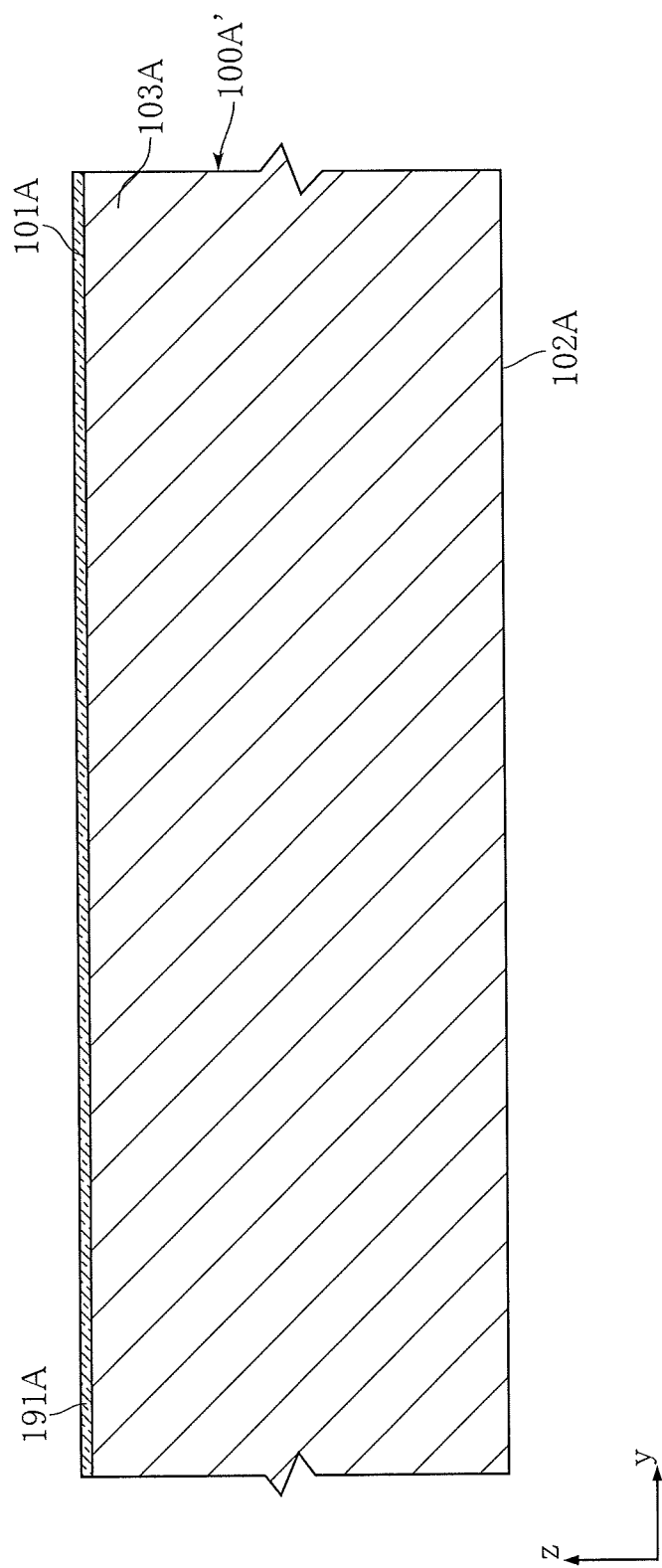
FIG. 4 is a cross-sectional view showing relevant parts of a step of a method for manufacturing the semiconductor device shown in FIG. 1.

First, a substrate material 100A' is prepared as shown in FIG. 4. The substrate material 100A' is made of a single-crystal semiconductor material, and is made of single-crystal Si in the present embodiment. The thickness of the substrate material 100A' is about 600 μm, for example. The substrate material 100A' is of a size according to which a plurality of the above-described substrates 100A of the semiconductor device 1A can be obtained. That is to say, the following manufacturing steps are based on a method for manufacturing multiple semiconductor devices 1A at once. It is possible to use a method for manufacturing one semiconductor device 1A, but considering industrial efficiency, it is practical to use a method for manufacturing multiple semiconductor devices 1A at once.

The substrate material 100A' has the main surface 101A and the back surface 102A, which face mutually opposite sides in the z direction. In the present embodiment, a surface whose crystal orientation is (100), that is, a (100) surface, is used as the main surface 101A. Next, a mask layer 191A made of $SiO_2$ is formed through, for example, oxidation of the main surface 101A. The thickness of the mask layer 191A is about 0.7 to 1.0 μm, for example.

Figure 5:
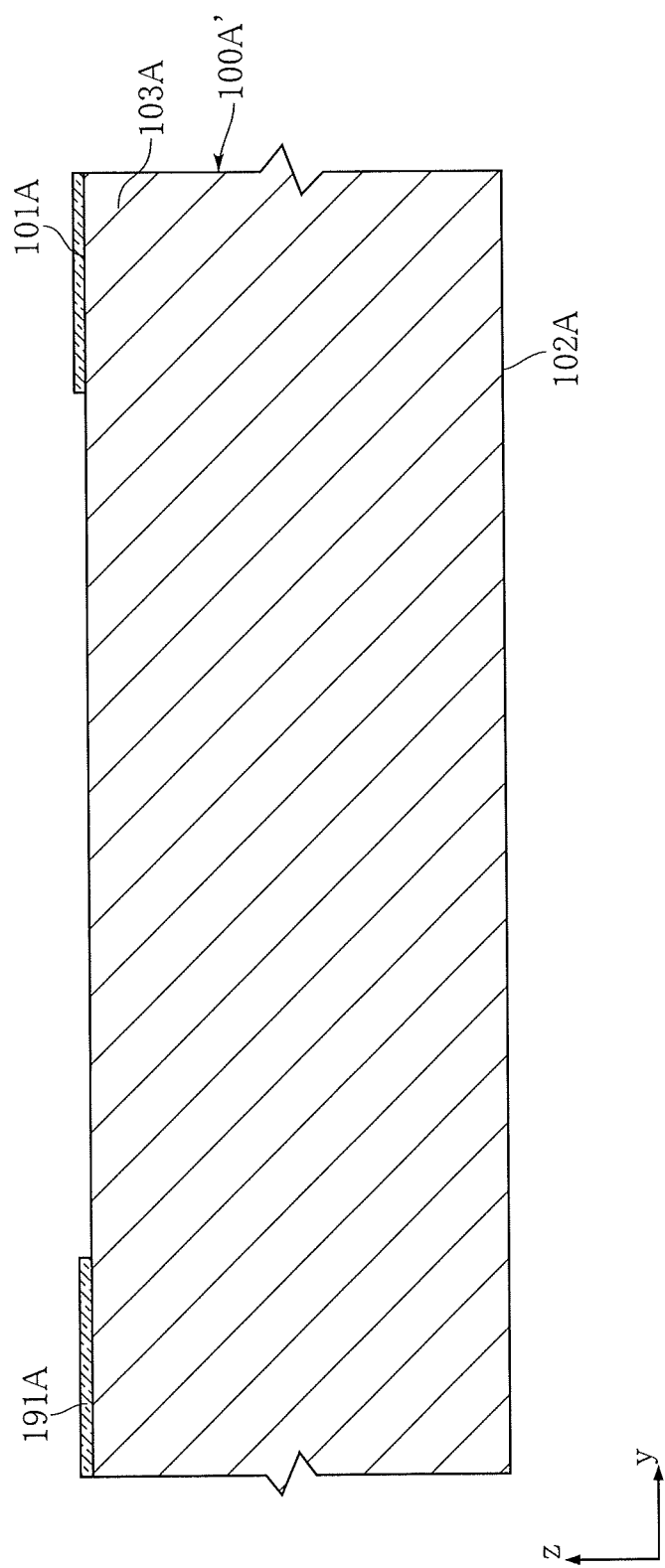
FIG. 5 is a cross-sectional view showing relevant parts of a step of the method for manufacturing the semiconductor device shown in FIG. 1.

Next, as shown in FIG. 5, patterning by means of, for example, etching is performed on the mask layer 191A. According to this, an opening is formed in the mask layer 191A. The shape and size of the opening is set according to the shape and size of the recessed portion 105A that is to ultimately be obtained. The opening has a rectangular shape, for example.

Figure 6:
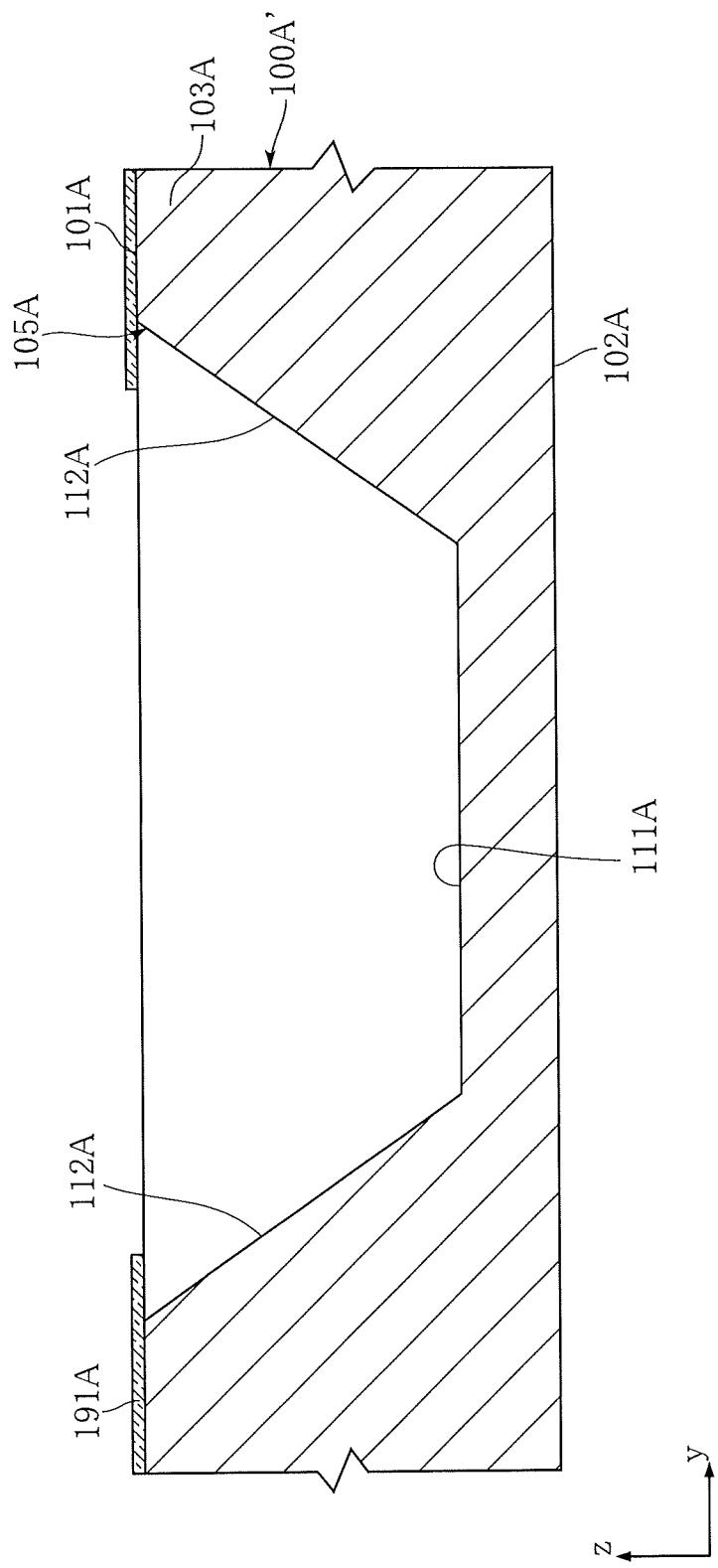
FIG. 6 is a cross-sectional view showing relevant parts of a step of the method for manufacturing the semiconductor device shown in FIG. 1.

Next, the recessed portion 105A is formed as shown in FIG. 6. The recessed portion 105A is formed through anisotropic etching using KOH, for example. KOH is an example of an alkali etching solution by which anisotropic etching that is favorable for single-crystal Si can be realized. By performing anisotropic etching, the recessed portion 105A having the bottom surface 111A and the four inclined inner surfaces 112A is formed. The angle formed by the inclined inner surfaces 112A with respect to the xy plane is about 55°. In the present embodiment, the depth of the recessed portion 105A is about 440 μm.

Figure 7:
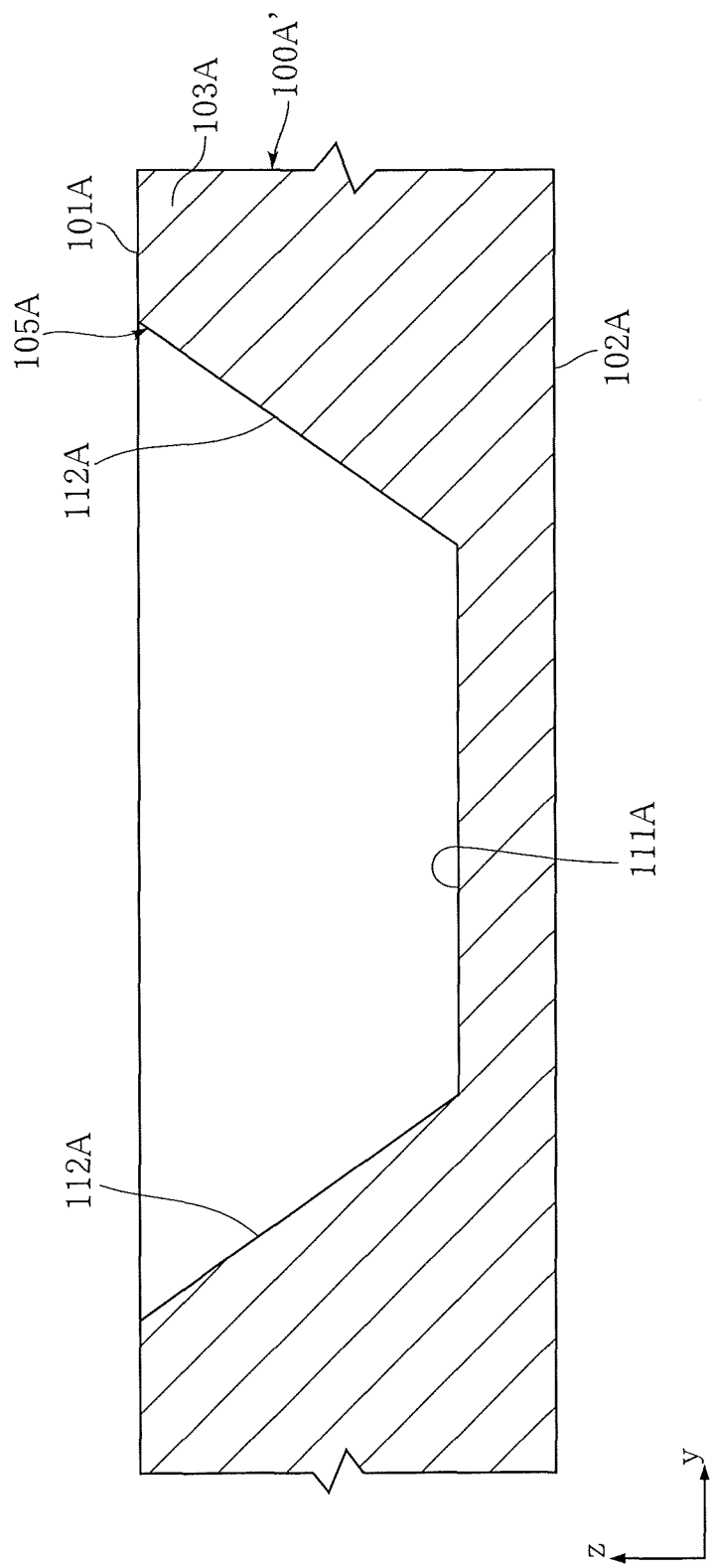
FIG. 7 is a cross-sectional view showing relevant parts of a step of the method for manufacturing the semiconductor device shown in FIG. 1.

Next, the mask layer 191A is removed as shown in FIG. 7. The removal is performed through etching using HF, for example.

Figure 8:
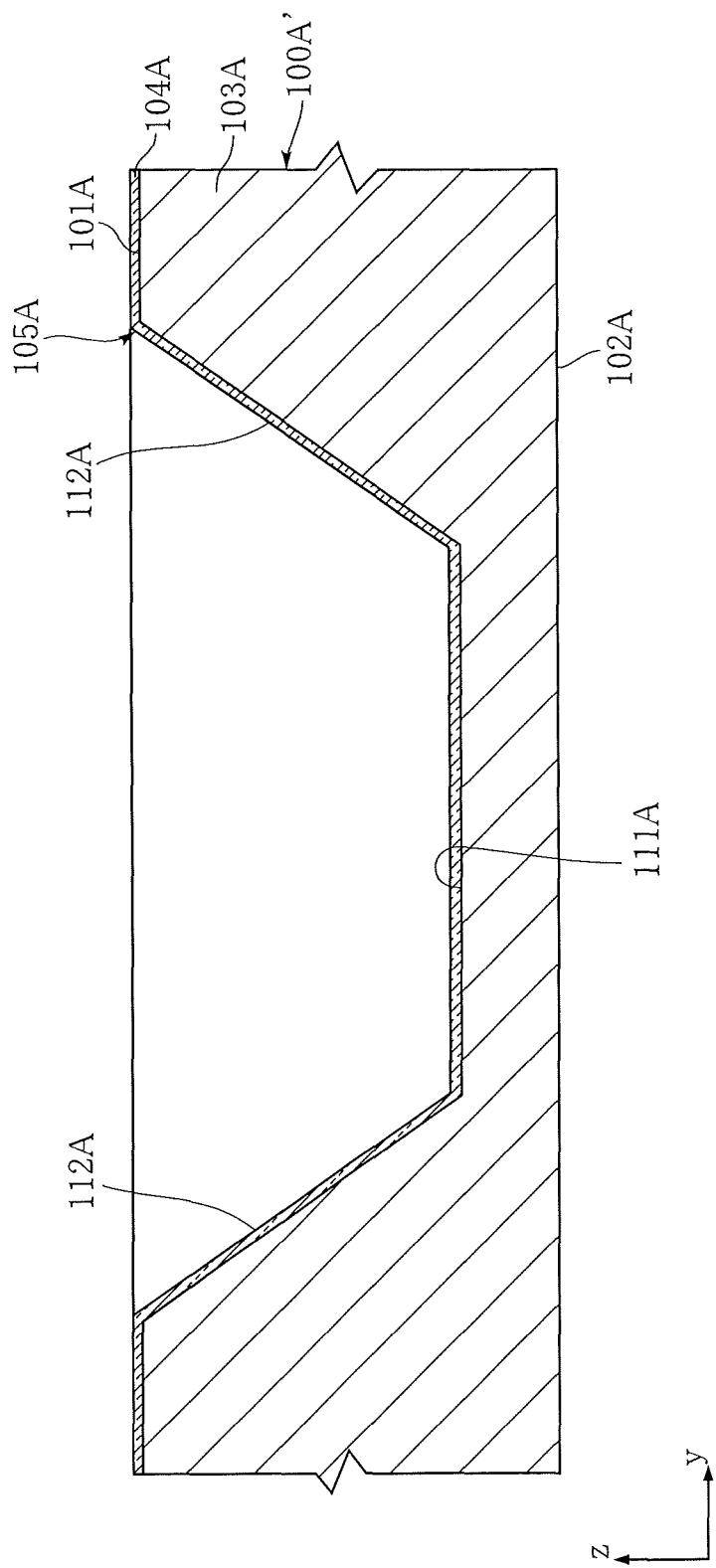
FIG. 8 is a cross-sectional view showing relevant parts of a step of the method for manufacturing the semiconductor device shown in FIG. 1.

Next, the insulating layer 104A made of $SiO_2$, for example, is formed as shown in FIG. 8. The insulating layer 104A is formed through oxidation of the entire portion of the substrate material 100A' on the side opposite to the back surface 102A. According to this, the insulating layer 104A with a thickness of about 0.7 to 1.0 μm, for example, is obtained.

Figure 9:
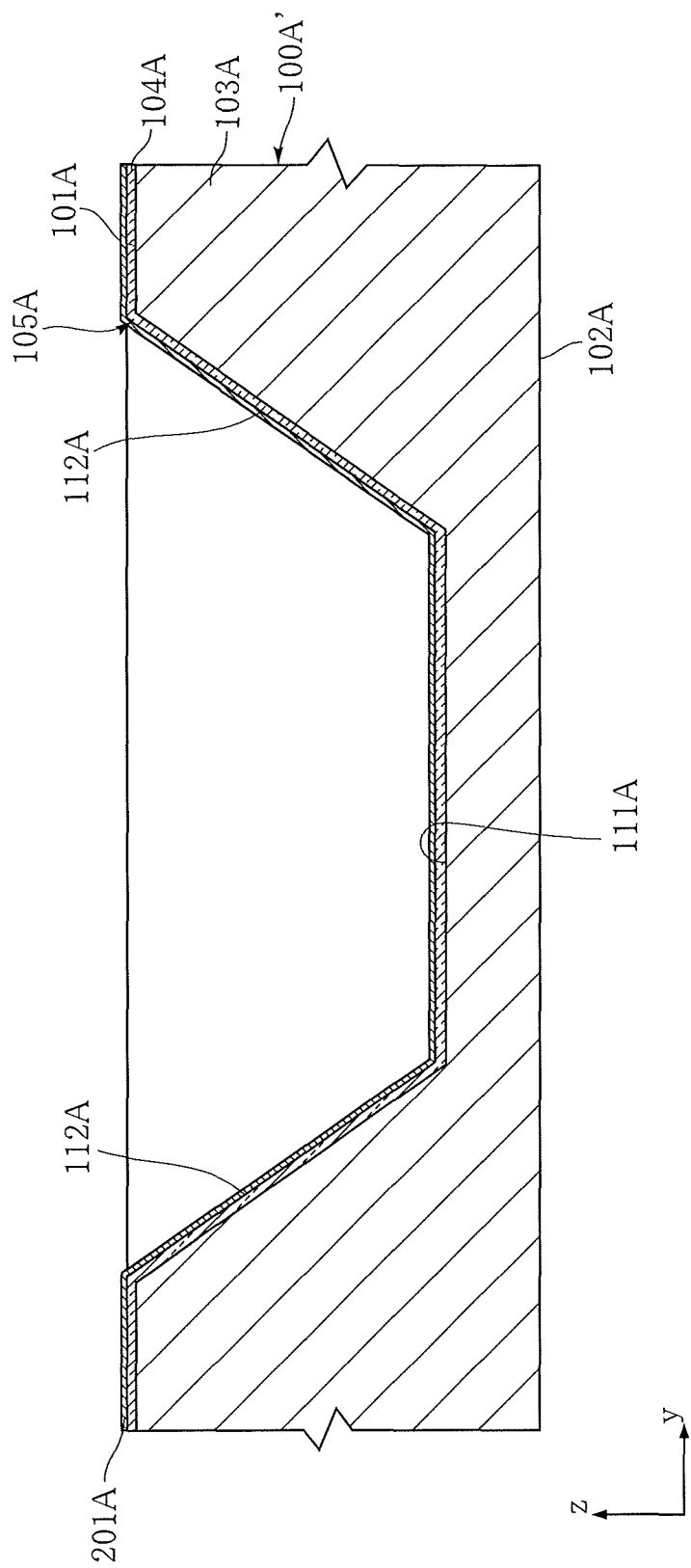
FIG. 9 is a cross-sectional view showing relevant parts of a step of the method for manufacturing the semiconductor device shown in FIG. 1.

Next, the barrier seed layer 201A is formed as shown in FIG. 9. The barrier seed layer 201A is formed through sputtering, for example. Specifically, a layer made of Ti is formed on the insulating layer 104A through sputtering. The layer made of Ti functions as a barrier layer. Next, a layer made of Cu is formed on the barrier layer through sputtering. The layer made of Cu functions as a seed layer. The barrier seed layer 201A is obtained through this kind of sputtering.

Figure 10:
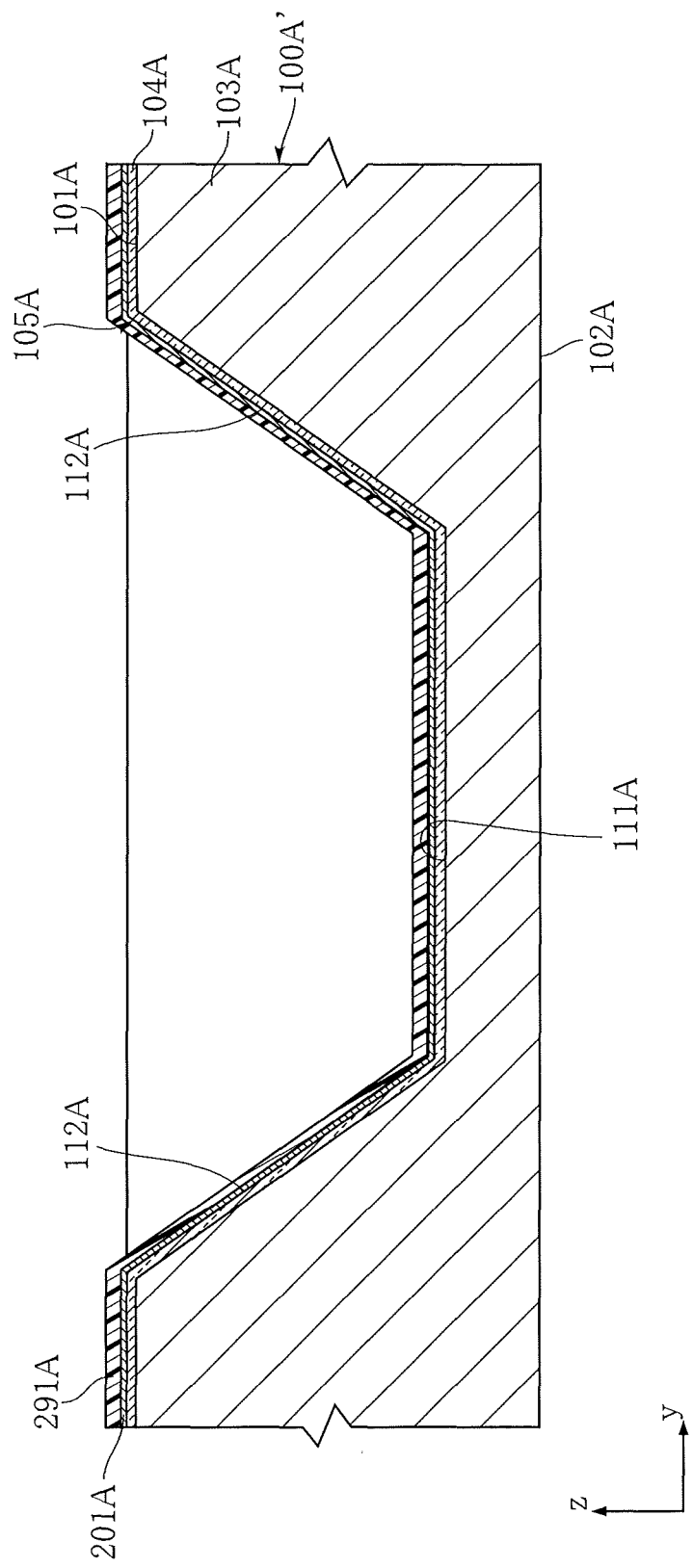
FIG. 10 is a cross-sectional view showing relevant parts of a step of the method for manufacturing the semiconductor device shown in FIG. 1.

Next, a mask layer 291A is formed as shown in FIG. 10. The mask layer 291A is formed by spray-coating with photosensitive resist resin, for example.

Figure 11:
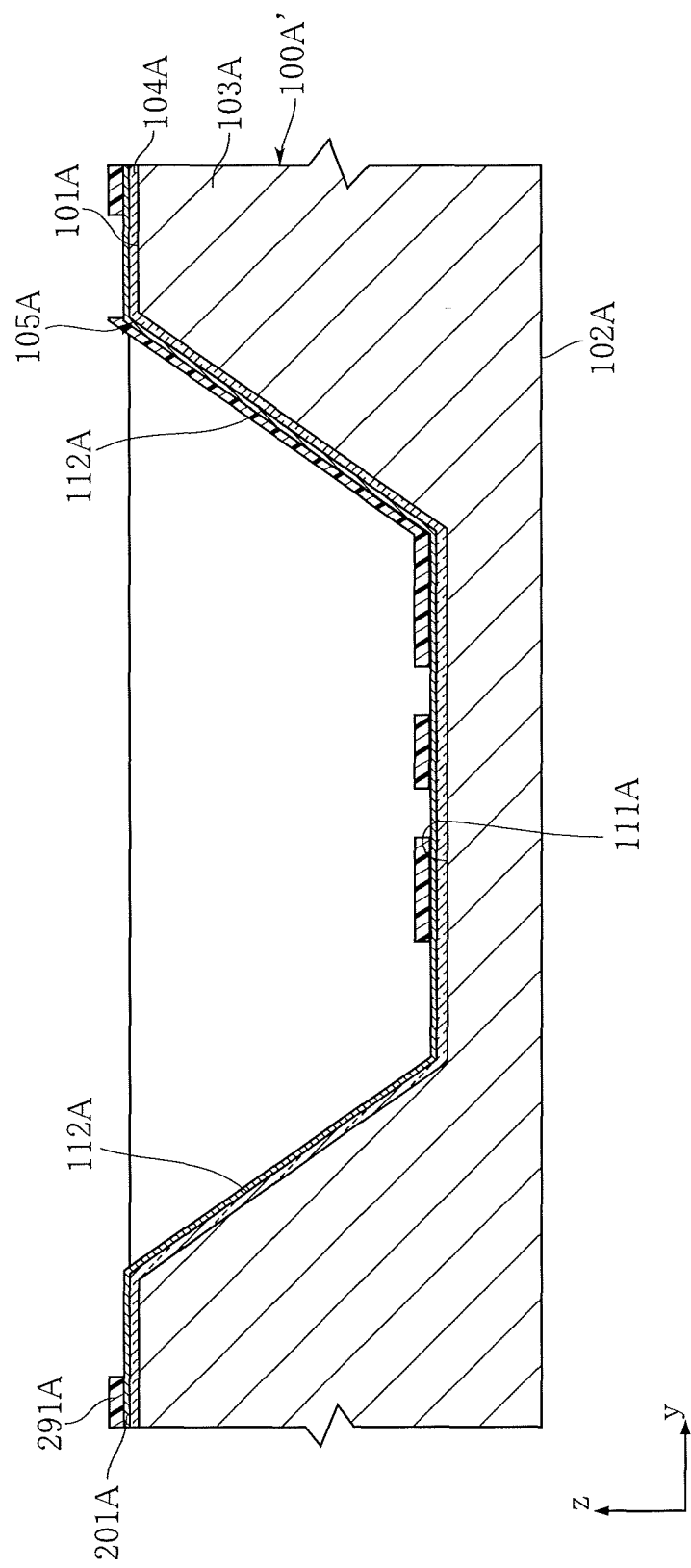
FIG. 11 is a cross-sectional view showing relevant parts of a step of the method for manufacturing the semiconductor device shown in FIG. 1.

Next, patterning is carried out on the mask layer 291A as shown in FIG. 11. The patterning is performed by performing exposure and developing using a photolithography method, for example, on the mask layer 291A and thereby removing predetermined sites. The shape of the mask layer 291A obtained through the patterning corresponds to the shapes of the first wiring layer 210A, the external terminal 240A, and the connection path 250A of the above-described conducting portion 200A. Note that in correspondence with the fact that the recessed portion 105A has a certain amount of depth, multiple instances of the exposure may be performed with different focus depths in the exposure.

Figure 12:
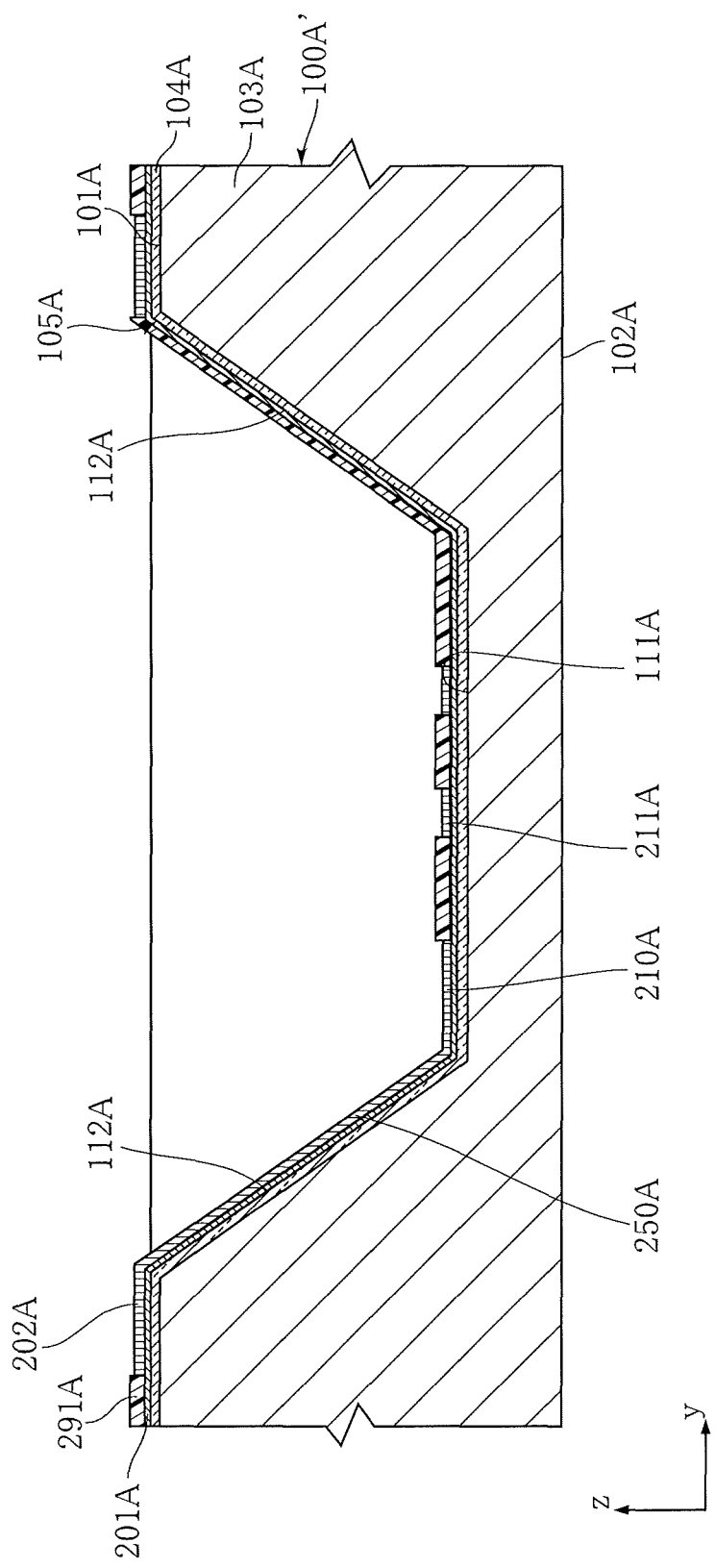
FIG. 12 is a cross-sectional view showing relevant parts of a step of the method for manufacturing the semiconductor device shown in FIG. 1.

Next, the plating layer 202A is formed as shown in FIG. 12. The plating layer 202A is formed through electrolytic plating using the seed layer of the barrier seed layer 201A, for example. As a result, the plating layer 202A, which is made of Cu for example, is obtained. The thickness of the plating layer 202A is about 5 μm, for example. The plating layer 202A is in the shape of the above-described first wiring layer 210A and connection path 250A.

Figure 13:
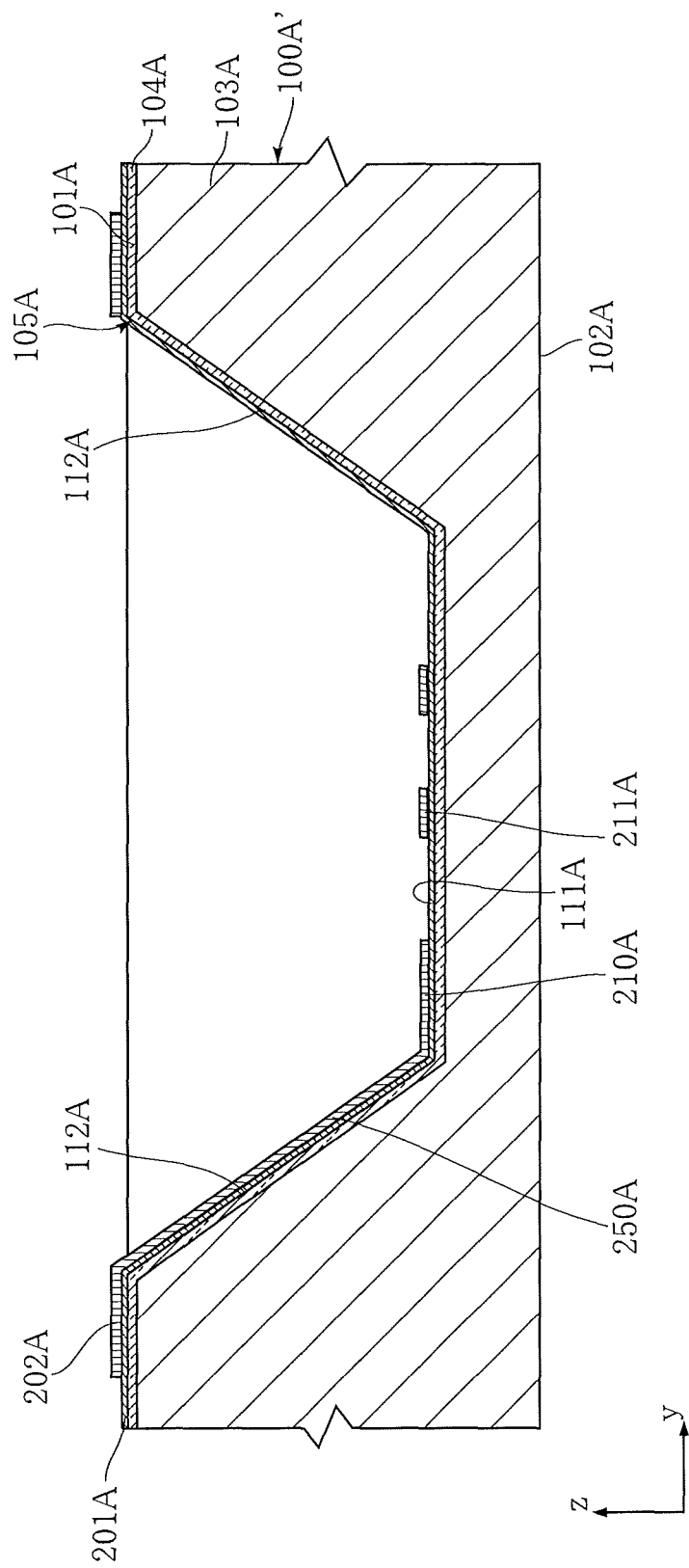
FIG. 13 is a cross-sectional view showing relevant parts of a step of the method for manufacturing the semiconductor device shown in FIG. 1.
Figure 14:
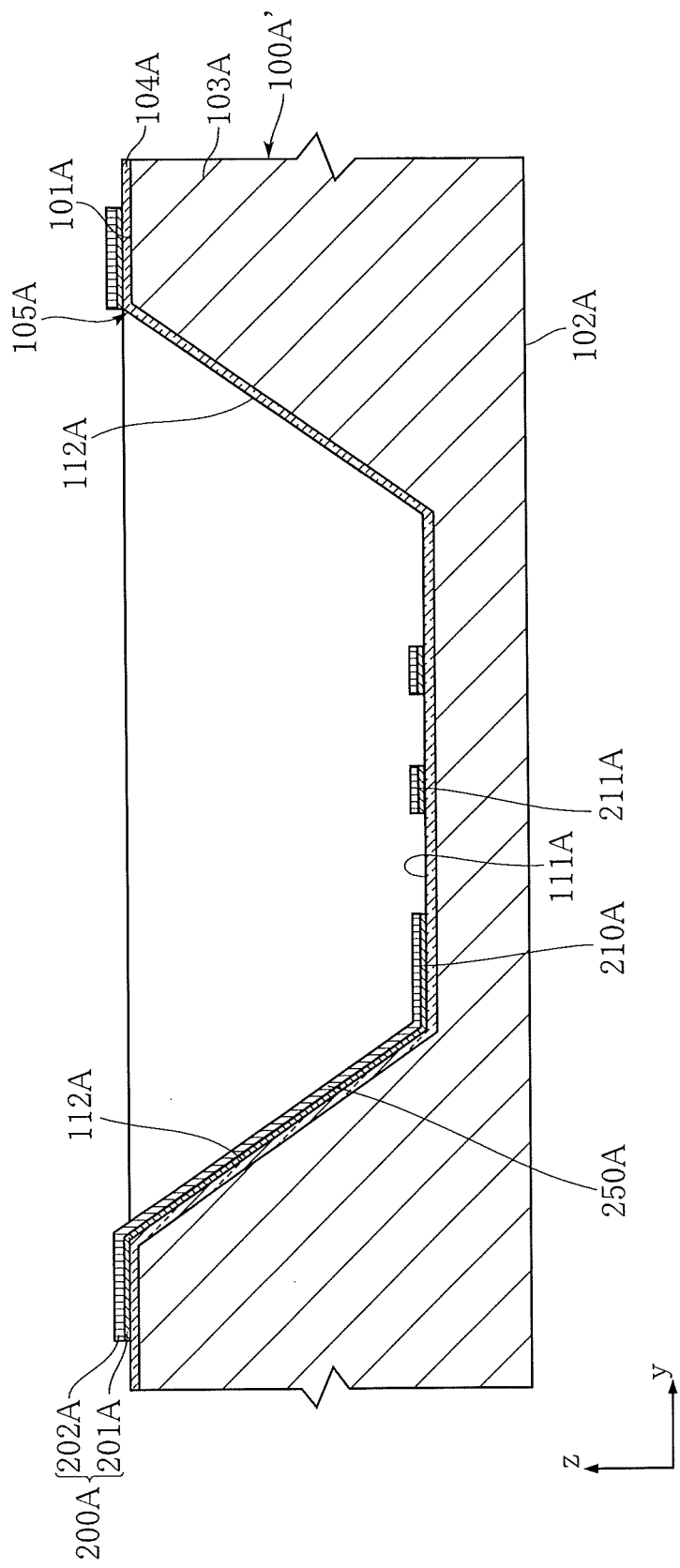
FIG. 14 is a cross-sectional view showing relevant parts of a step of the method for manufacturing the semiconductor device shown in FIG. 1.

Next, the mask layer 291A is removed as shown in FIG. 13. Next, the portions of the barrier seed layer 201A that are exposed from the plating layer 202A is removed as shown in FIG. 14. The barrier seed layer 201A is removed through wet etching, for example. According to this, the first wiring layer 210A and connection path 250A, which are composed of the barrier seed layer 201A and the plating layer 202A that have both been subjected to patterning, are obtained.

Figure 15:
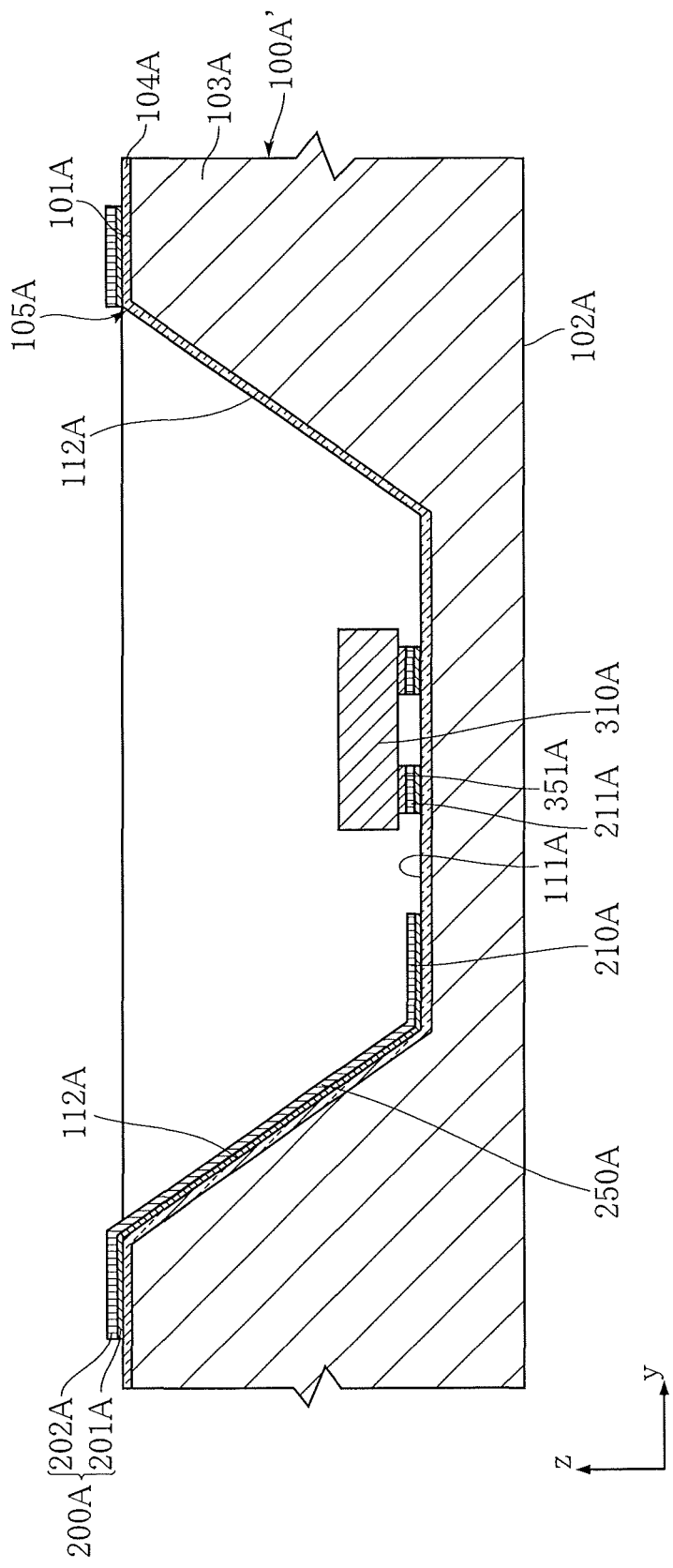
FIG. 15 is a cross-sectional view showing relevant parts of a step of the method for manufacturing the semiconductor device shown in FIG. 1.

Next, the first circuit element 310A is mounted as shown in FIG. 15. Solder balls that are to be the solder 351A are formed on the first circuit element 310A. Also, the solder balls are coated with flax. The first circuit element 310A is mounted on the bottom surface 111A using the adhesiveness of the flax. Also, the mounting of the first circuit element 310A is completed by melting the solder balls with a reflow oven and then allowing them to solidify.

Figure 16:
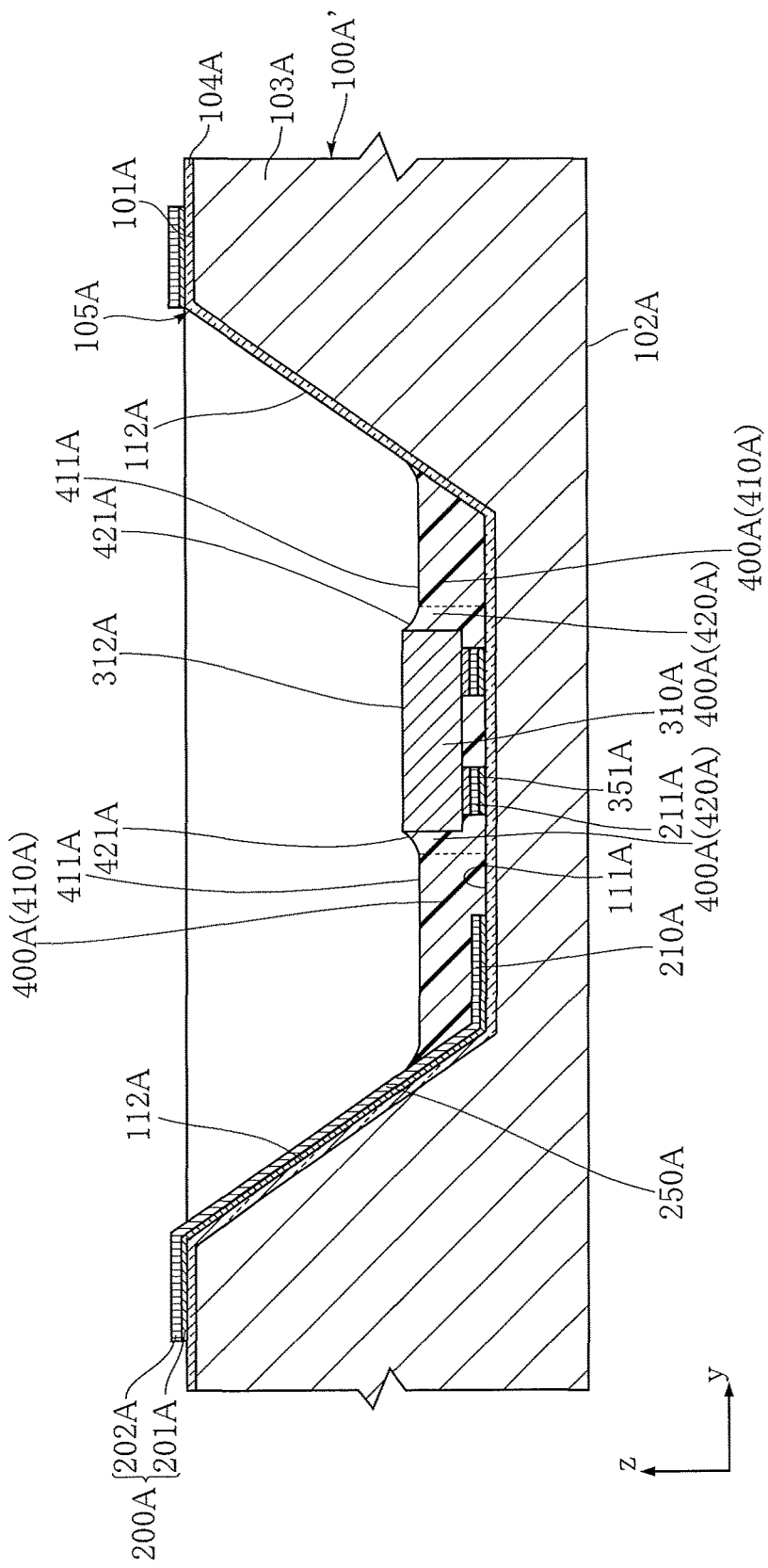
FIG. 16 is a cross-sectional view showing relevant parts of a step of the method for manufacturing the semiconductor device shown in FIG. 1.

Next, the insulating film 400A is formed as shown in FIG. 16. The insulating film 400A is formed through spray-coating with polyimide resin, for example. Spray-coating is performed using a mask with a predetermined pattern shape, for example. According to this, the insulating film 400A including the flat portions 410A and the inclined portions 420A is formed on the bottom surface 111A, excluding the upper surface 312A of the first circuit element 310A.

Figure 17:
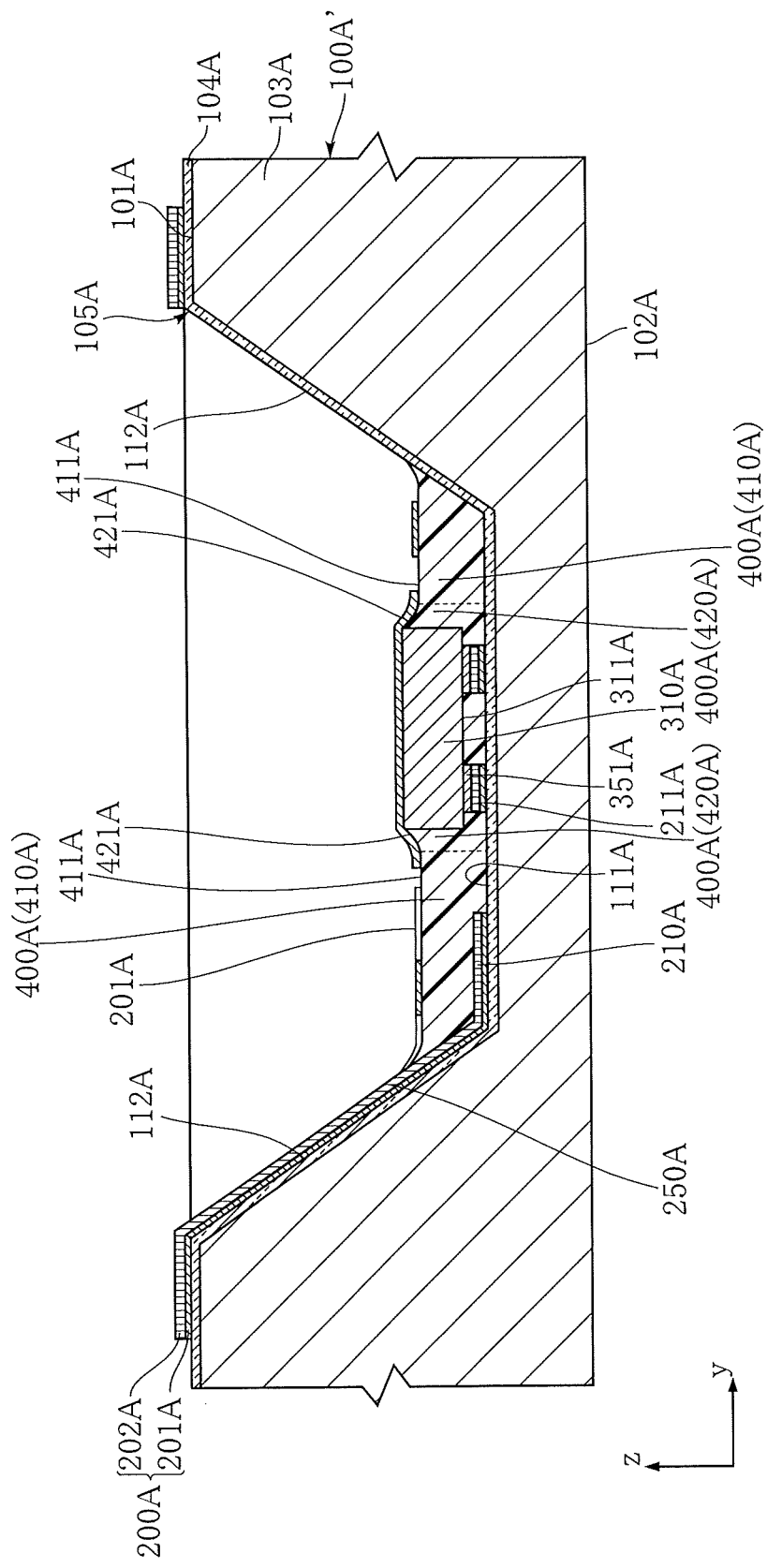
FIG. 17 is a cross-sectional view showing relevant parts of a step of the method for manufacturing the semiconductor device shown in FIG. 1.

Next, the second wiring layer 220A is formed. First, the barrier seed layer 201A is formed on the insulating film 400A as shown in FIG. 17. The barrier seed layer 201A is formed through a mask vapor deposition method, for example. Specifically, a layer made of Ti is formed at predetermined sites on the insulating film 400A through mask vapor deposition. The layer made of Ti functions as a barrier layer. Next, a layer made of Cu is formed on the barrier layer through mask vapor deposition. The layer made of Cu functions as a seed layer. The barrier seed layer 201A is obtained through this kind of sputtering.

Figure 18:
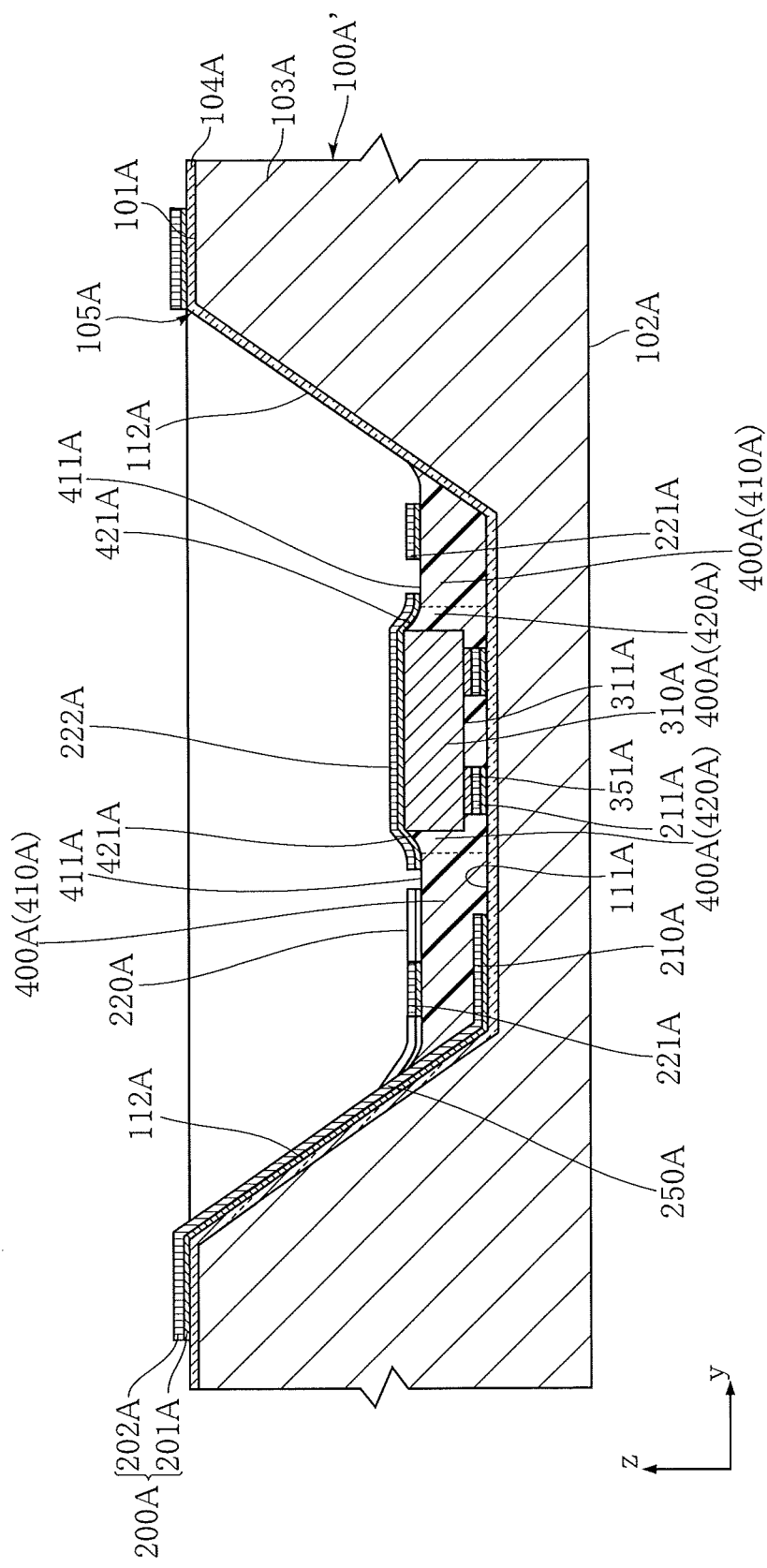
FIG. 18 is a cross-sectional view showing relevant parts of a step of the method for manufacturing the semiconductor device shown in FIG. 1.

Next, the plating layer 202A is formed as shown in FIG. 18. The plating layer 202A is formed through electrolytic plating using the seed layer of the barrier seed layer 201A, for example. As a result, the plating layer 202A, which is made of Cu for example, is obtained. The thickness of the plating layer 202A is about 5 μm, for example. The plating layer 202A is in the shape of the above-described second wiring layer 220A. Thus, the second wiring layer 220A including the second element pads 221A and the shield layer 222A is formed.

Figure 19:
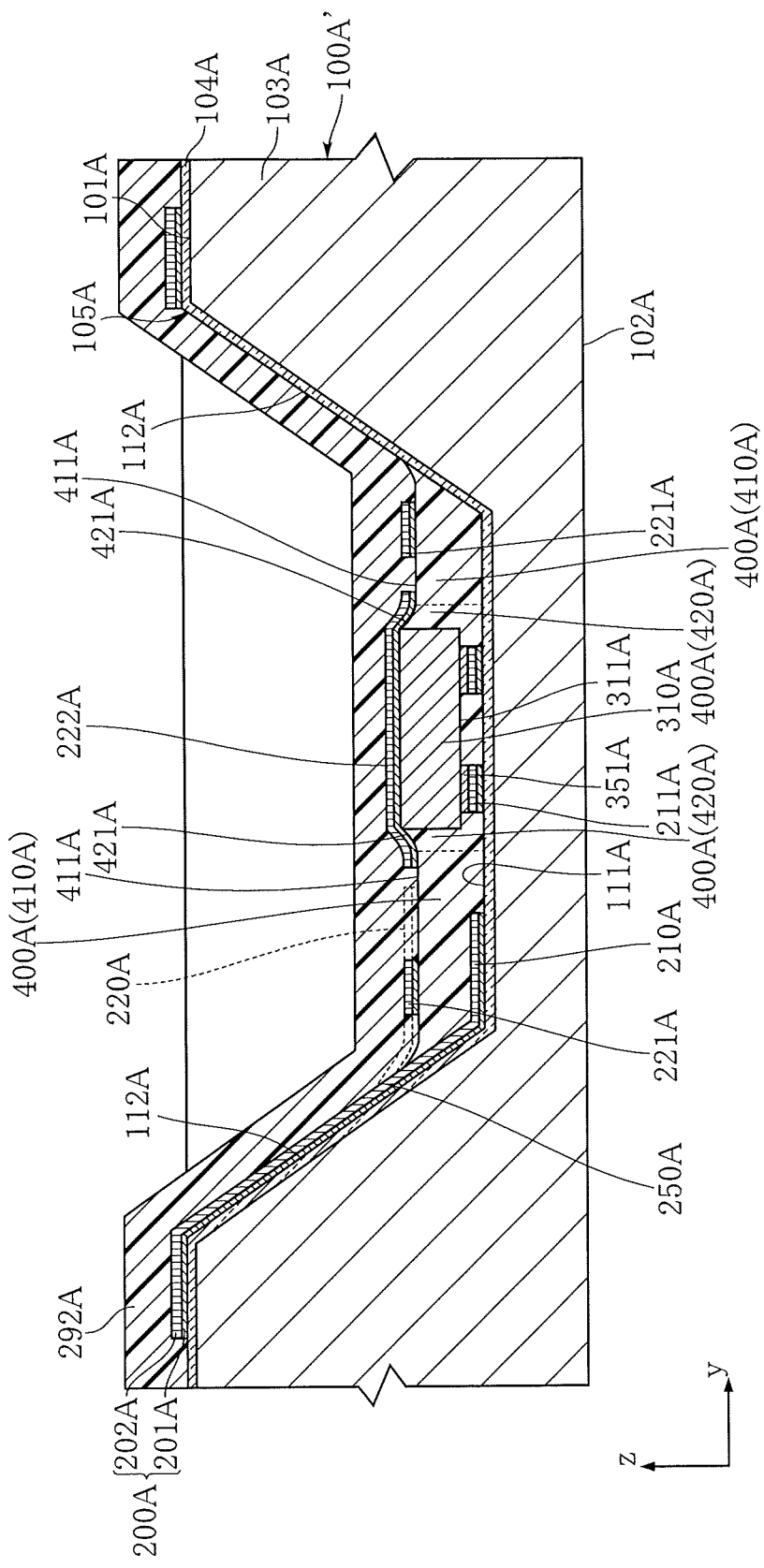
FIG. 19 is a cross-sectional view showing relevant parts of a step of the method for manufacturing the semiconductor device shown in FIG. 1.

Next, a resist layer 292A is formed as shown in FIG. 19. The resist layer 292A is formed through spray-coating with photosensitive resist resin, for example.

Figure 20:
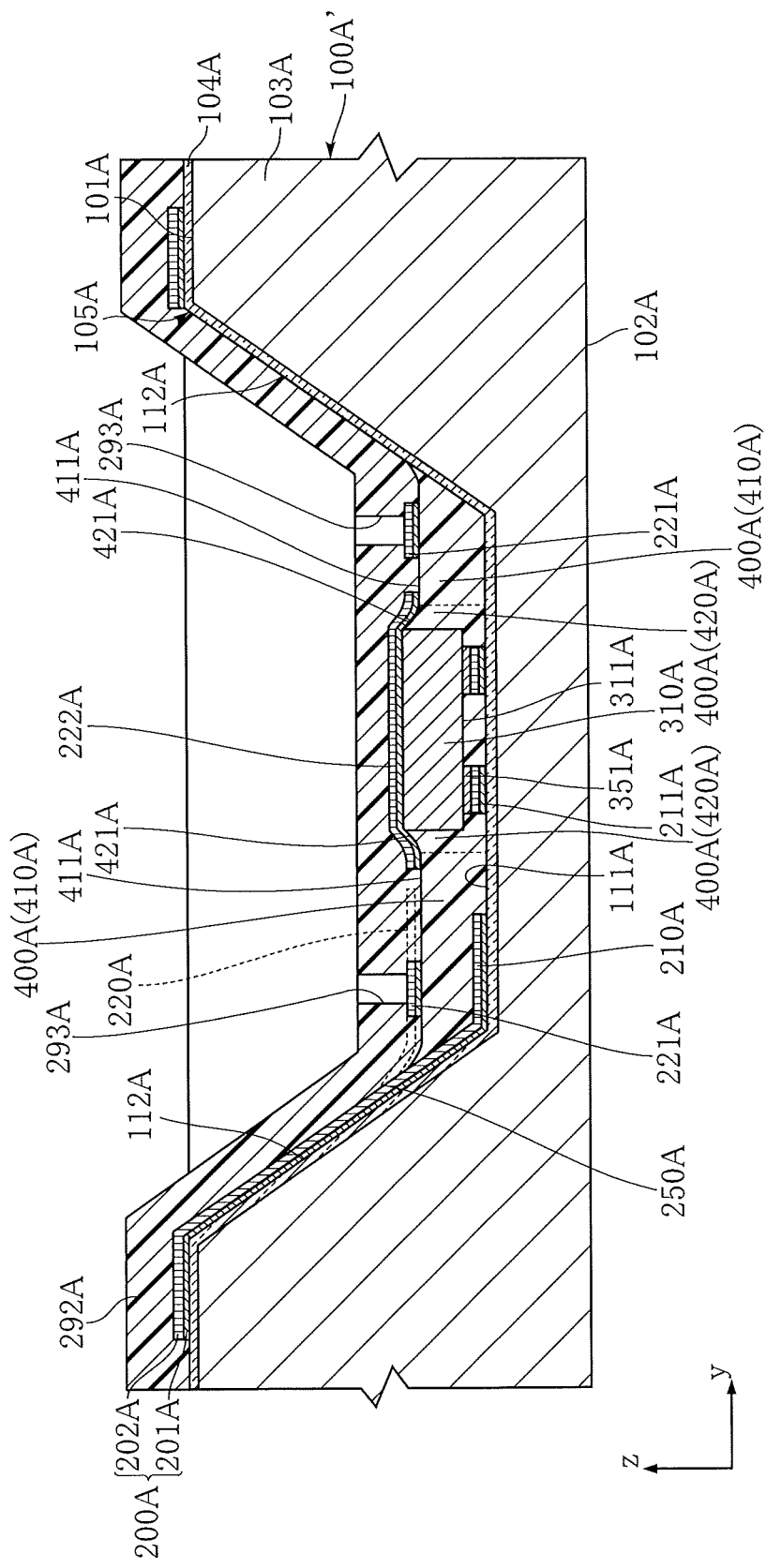
FIG. 20 is a cross-sectional view showing relevant parts of a step of the method for manufacturing the semiconductor device shown in FIG. 1.

Next, patterning is carried out on the resist layer 292A as shown in FIG. 20. The patterning is performed by performing exposure and developing using a photolithography method, for example, on the resist layer 292A and thereby removing predetermined sites. The shape of the resist layer 292A obtained through the patterning corresponds to the shape of the above-described column-like portions 230A. Here, openings 293A corresponding to the shape of the column-like portions 230A are formed in the resist layer, and portions of the second element pads 221A are exposed. Note that in correspondence with the fact that the recessed portion 105A has a certain amount of depth, multiple instances of the exposure may be performed with different focus depths in the exposure.

Figure 21:
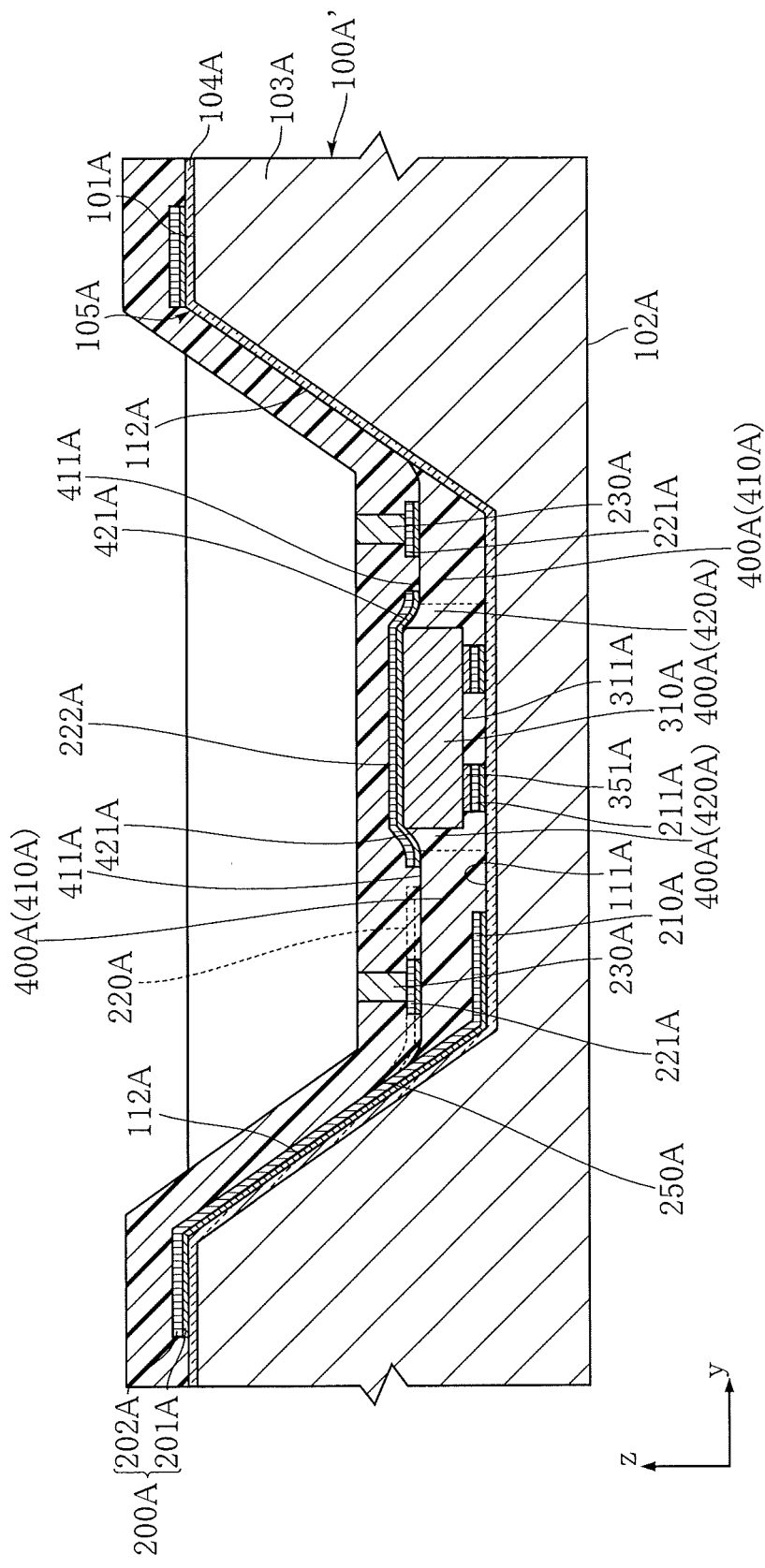
FIG. 21 is a cross-sectional view showing relevant parts of a step of the method for manufacturing the semiconductor device shown in FIG. 1.

Next, the column-like portions 230A are formed as shown in FIG. 21. The column-like portions 230A are formed through electrolytic plating using the second element pads 221A, for example. As a result, the column-like portions 230A, which are made of Cu for example, are obtained.

Figure 22:
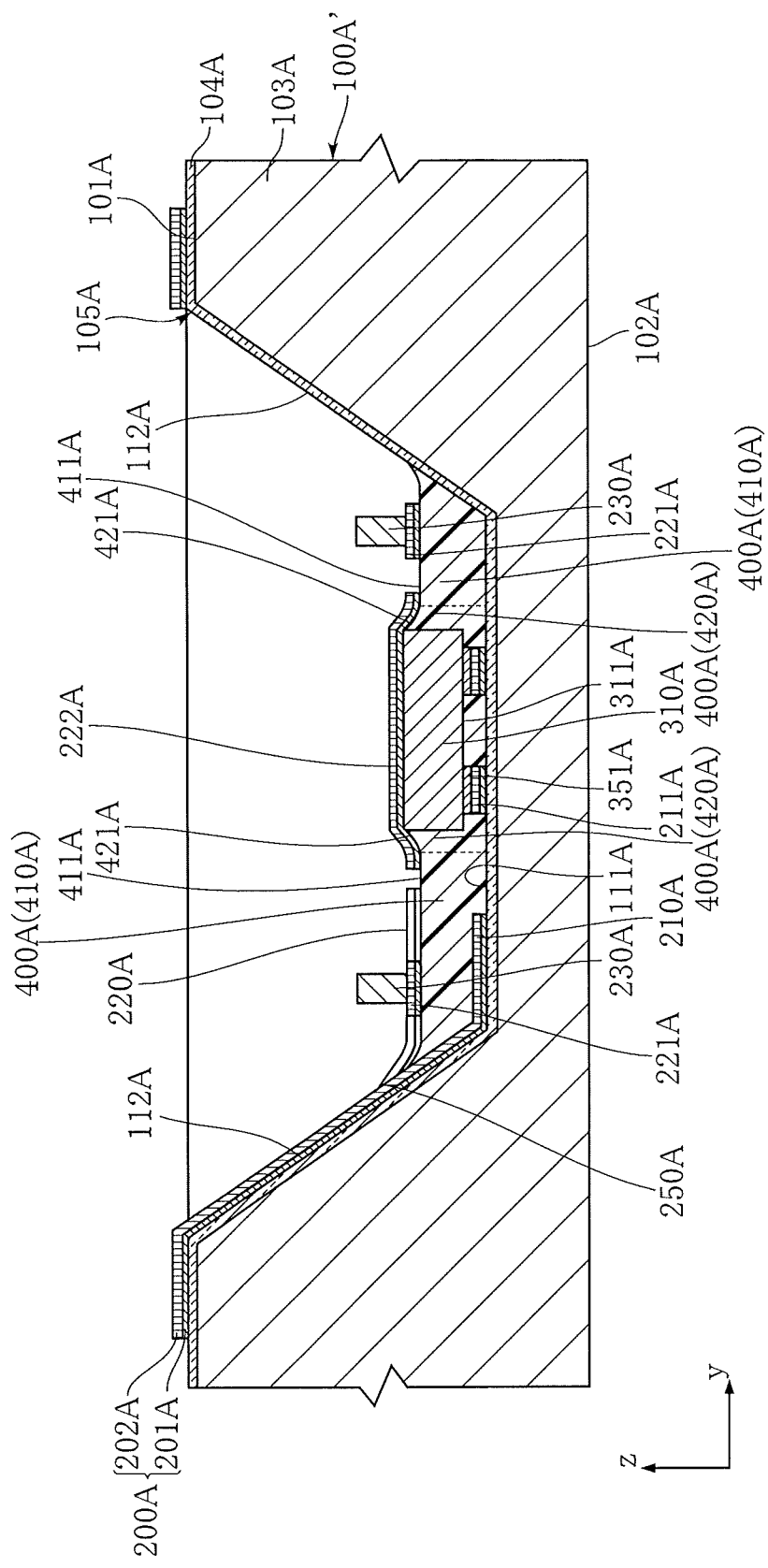
FIG. 22 is a cross-sectional view showing relevant parts of a step of the method for manufacturing the semiconductor device shown in FIG. 1.

Next, the resist layer 292A is removed as shown in FIG. 22. The removal is performed through etching using HF, for example.

Figure 23:
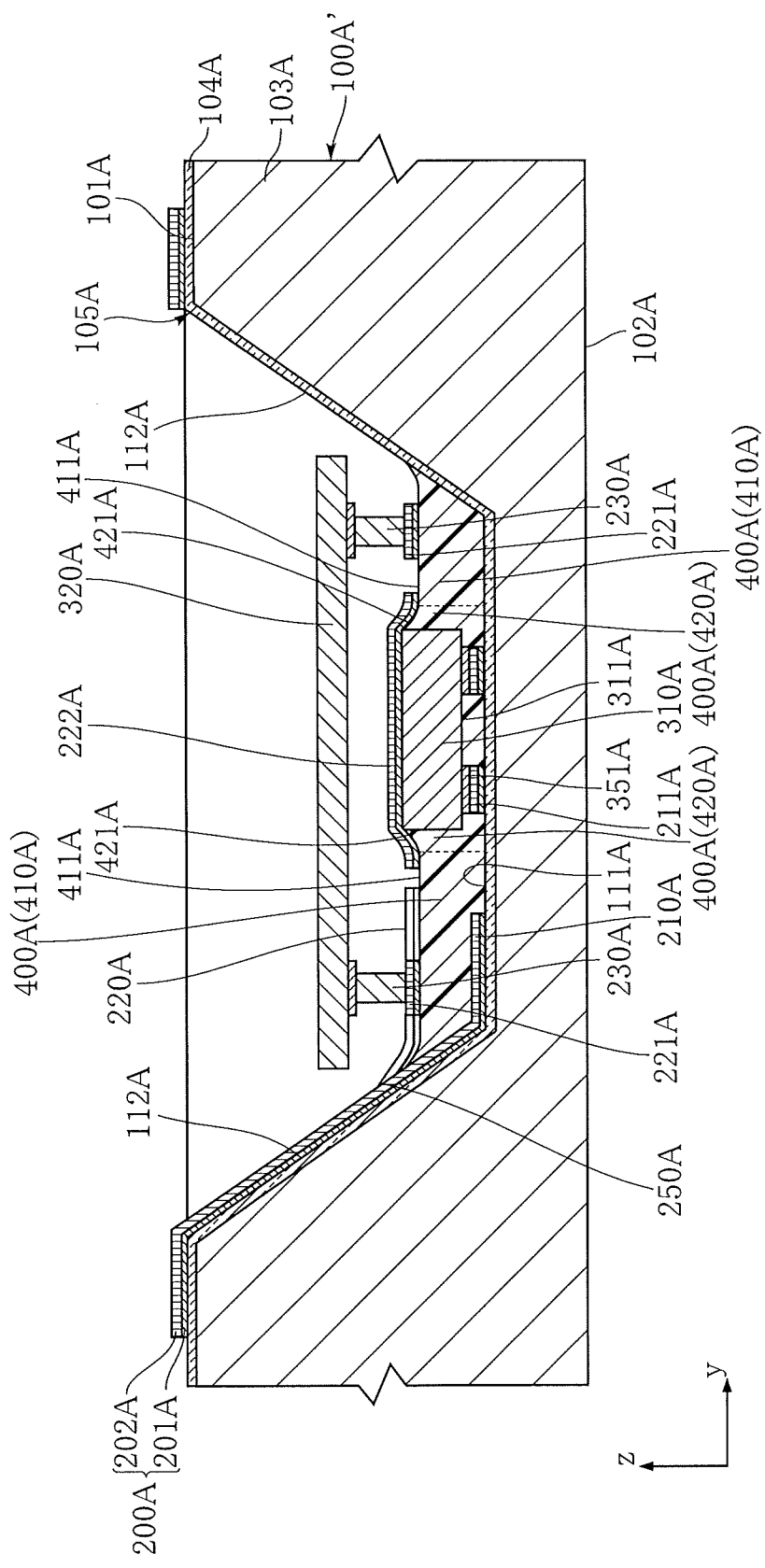
FIG. 23 is a cross-sectional view showing relevant parts of a step of the method for manufacturing the semiconductor device shown in FIG. 1.

Next, the second circuit element 320A is mounted as shown in FIG. 23. Solder balls that are to be the solder 351A are formed on the second circuit element 320A. Also, the solder balls are coated with flax. The second circuit element 320A is mounted on the column-like portions 230A using the adhesiveness of the flax. Also, the mounting of the second circuit element 320A is completed by melting the solder balls with a reflow oven and then allowing them to solidify.

Figure 24:
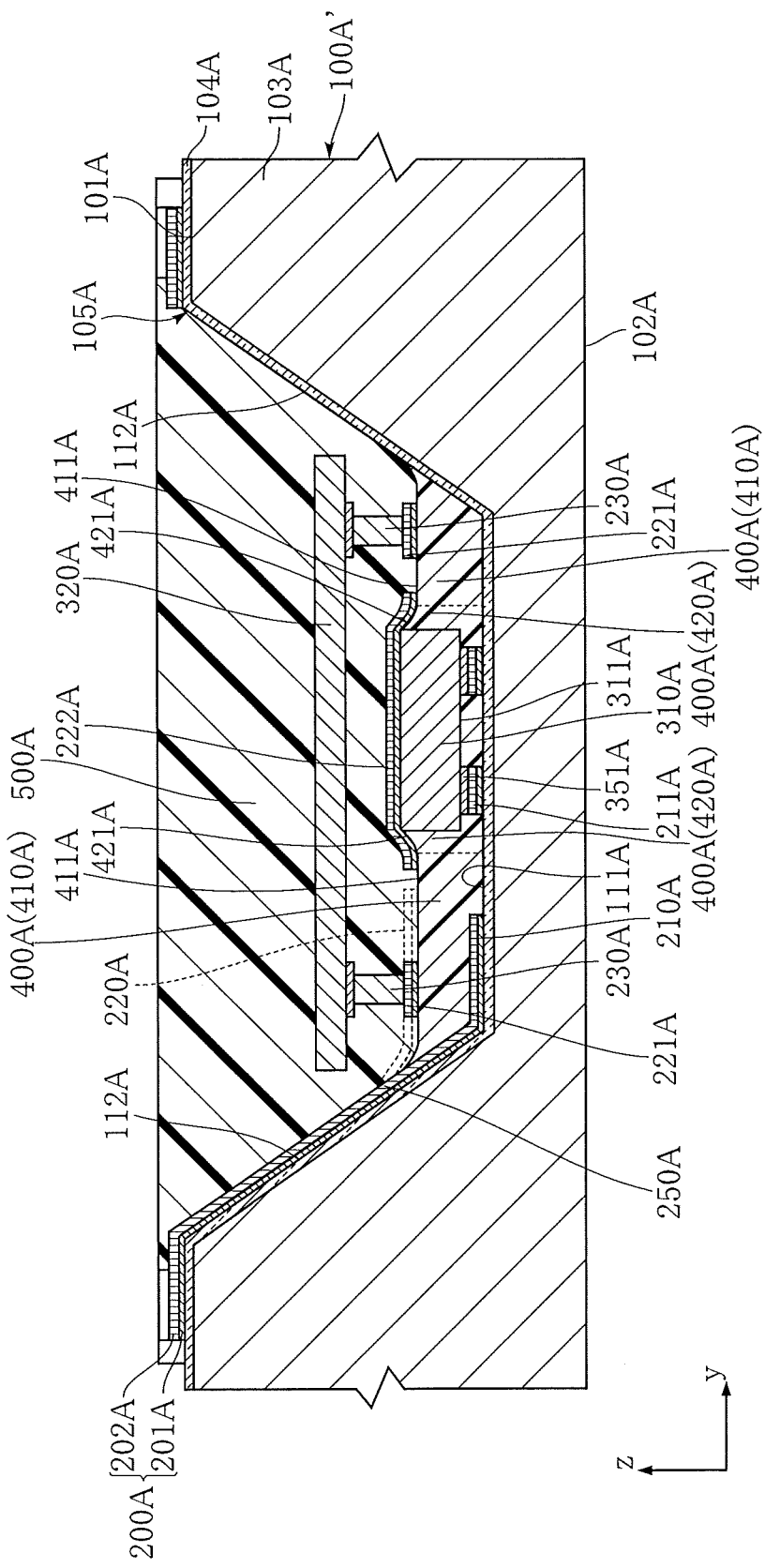
FIG. 24 is a cross-sectional view showing relevant parts of a step of the method for manufacturing the semiconductor device shown in FIG. 1.

Next, the sealing resin 500A is formed as shown in FIG. 24. The sealing resin 500A is formed by filling mainly the recessed portion 105A with a resin material that has excellent permeability and is cured through light exposure, and curing the resin material. In this case, the entirety of the second circuit element 320A is covered by the resin material. Meanwhile, a portion of the plating layer 202A on the main surface 101A is reliably exposed. Also, the sealing resin 500A is formed such that it does not overlap with a later-described cutting region. Note that examples of resin materials for forming the sealing resin 500A include epoxy resin, phenol resin, polyimide resin, polybenzoxazole (PBO) resin, and silicone resin. The sealing resin 500A may be either translucent resin or non-translucent resin, but in the present embodiment, non-translucent resin is preferable.

Figure 25:
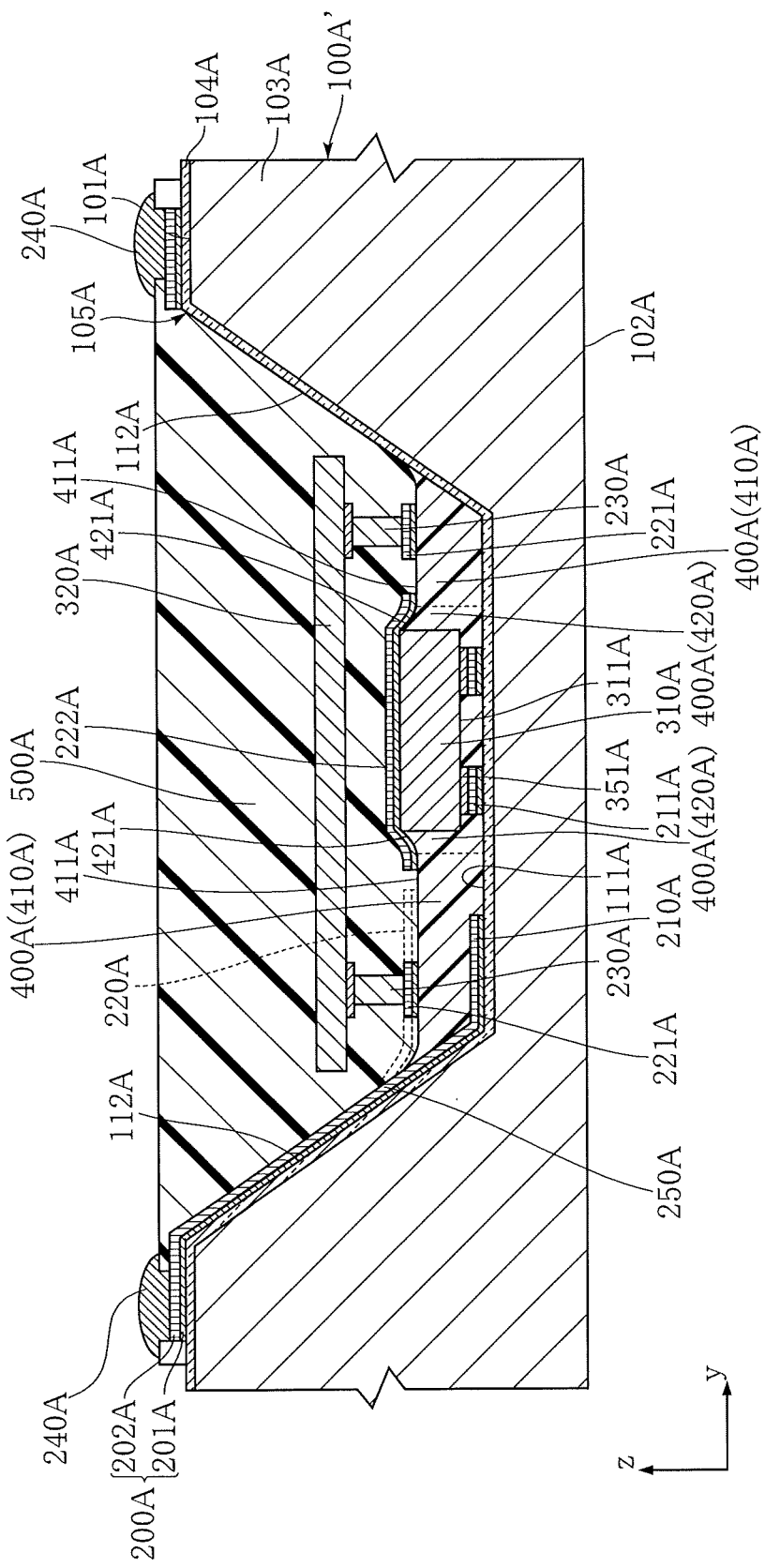
FIG. 25 is a cross-sectional view showing relevant parts of a step of the method for manufacturing the semiconductor device shown in FIG. 1.

Next, as shown in FIG. 25, bumps that swell in the z direction are formed by performing non-electrolytic plating on the external terminals 240A with a metal such as Ni, Pd, or Au, for example.

Figure 26:
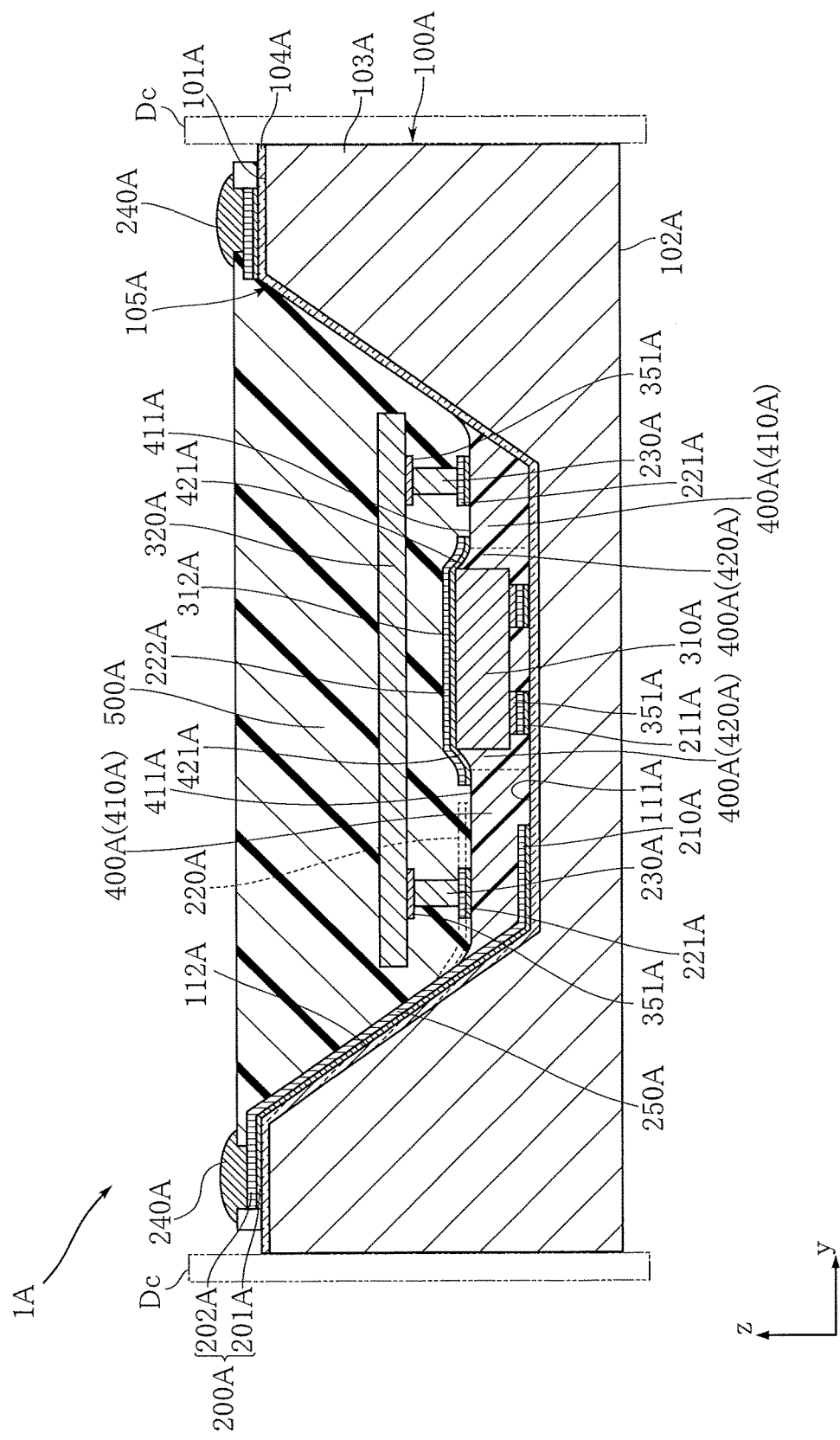
FIG. 26 is a cross-sectional view showing relevant parts of a step of the method for manufacturing the semiconductor device shown in FIG. 1.

Next, the substrate material 100' is cut with a dicer Dc, for example, as shown in FIG. 26. In this case, only the substrate material 100A' is cut with the dicer Dc, and the sealing resin 500A is not cut, for example. With this cutting, the semiconductor device 1A shown in FIGS. 1 and 2 is obtained.

Next, effects of the semiconductor device 1A will be described.

According to the present embodiment, the first circuit element 310A and the second circuit element 320A are accommodated by being arranged in a stacked form in the recessed portion 105A of the substrate 100A made of the semiconductor material. For this reason, it is not necessary to provide leads for supporting the first circuit element 310A and the second circuit element 320A. Compared with the case of molding the leads using a mold, it costs less to remake the shape of the substrate 100A made of the semiconductor material. Accordingly, the cost of the semiconductor device 1A can be reduced. The cost-reduction effect is particularly significant in the case where a small number of the semiconductor devices 1A are produced.

The conducting portion 200A includes the first wiring layer 210A formed on the bottom surface 111A of the recessed portion 105A, and the second wiring layer 220A that is located toward the main surface 101A with respect to the first wiring layer 210A in the normal direction (z direction) of the main surface 101A. With the configuration in which the first wiring layer 210A and the second wiring layer 220A are thus arranged in a stacked form in the z direction, a degree of freedom in the arrangement according to the position of the terminals of the first circuit element 310A and the second circuit element 320A mounted on the first wiring layer 210 and the second wiring layer 220A is ensured. Accordingly, this configuration is suitable for achieving a smaller size of the semiconductor device 1A and causing multiple elements, namely the first circuit element 310A and second circuit element 320A accommodated in the recessed portion 105A to function appropriately.

The first wiring layer 210A formed on the bottom surface 111A is covered by the insulating film 400A, and the second wiring layer 220A is formed on the insulating film 400A or on the first circuit element 310A. According to this, the insulating film 400A or the first circuit element 310A is interposed between the first wiring layer 210A and the second wiring layer 220A, whereby it is possible to suitably avoid a case in which and the first wiring layer 210A and the second wiring layer 220A are inappropriately electrically connected.

The second wiring layer 220A is formed so as to span across the upper surface 312A (surface facing the side opposite to the surface opposing the bottom surface 111A) of the first circuit element 310A and the insulating film 400A adjacent thereto. More specifically, the insulating film 400A includes the flat portion 410A having the flat surface 411A that is parallel to the bottom surface 111A, and the inclined portion 420A that is adjacent to the first circuit element 310A and has the inclined surface 421A that is inclined so as to be displaced toward the main surface 101A in the z direction as the distance between the inclined surface 421A and the first circuit element 310A decreases. Also, the second wiring layer 220A is formed so as to span across the upper surface 312A of the first circuit element 310A and the inclined portion 420A. With this kind of configuration, it is possible to suitably form the second wiring layer 220A for the upper surface 312A of the first circuit element 310A, which is not covered by the insulating film 400A, as well.

The second wiring layer 220A has the shield layer 222A interposed between the first circuit element 310A and the second circuit element 320A, and the shield layer 222A covers the entirety of the upper surface 312A of the first circuit element 310A. When mounting the semiconductor device 1A, the shield layer 222A is connected to ground via the connection path 250A and the external terminals 240A. The first circuit element 310A covered by the second circuit element 320A, which is a wireless communication element, is easily influenced by radio waves. In the present embodiment, by equipping the shield layer 222A with the above-described configuration, it is possible to prevent the influence of radio waves and prevent malfunction of the first circuit element 310A.

Due to the substrate 100A being made of a single-crystal semiconductor material represented by Si, the inclined inner surfaces 112A can be finished as surfaces that are accurately inclined by a known predetermined angle with respect to the bottom surface 111A. In particular, due to the substrate 100A being made of Si and a (100) surface being used as the main surface 101A, the angles of the four inclined inner surfaces 112A with respect to the bottom surface 111A can all be set to around 55°. Accordingly, the semiconductor device 1A can be given a well-balanced shape configuration.

The insulating film 400A is formed on the bottom surface 111A in the recessed portion 105A so as to cover at least a part of the first circuit element 310A. By mounting the first circuit element 310A on the bottom surface 111A and mounting the second circuit element 320A on the insulating film 400A, it is possible to three-dimensionally arrange the first circuit element 310A and the second circuit element 320A at different locations in the z direction. Accordingly, it is possible to achieve both a smaller size and improved function of the semiconductor device 1A.

The conducting portion 200A has the multiple column-like portions 230A. The column-like portions 230A have end portions that are connected to the second wiring layer 220A and extend in the depth direction of the recessed portion 105A inside of the sealing resin 500A. Also, the second circuit element 320A is mounted on the upper ends of the column-like portions 230A. With this kind of configuration, three-dimensional arrangement of the first circuit element 310A and the second circuit element 320A in a small space is achieved while interference therebetween is avoided.

Figure 27:
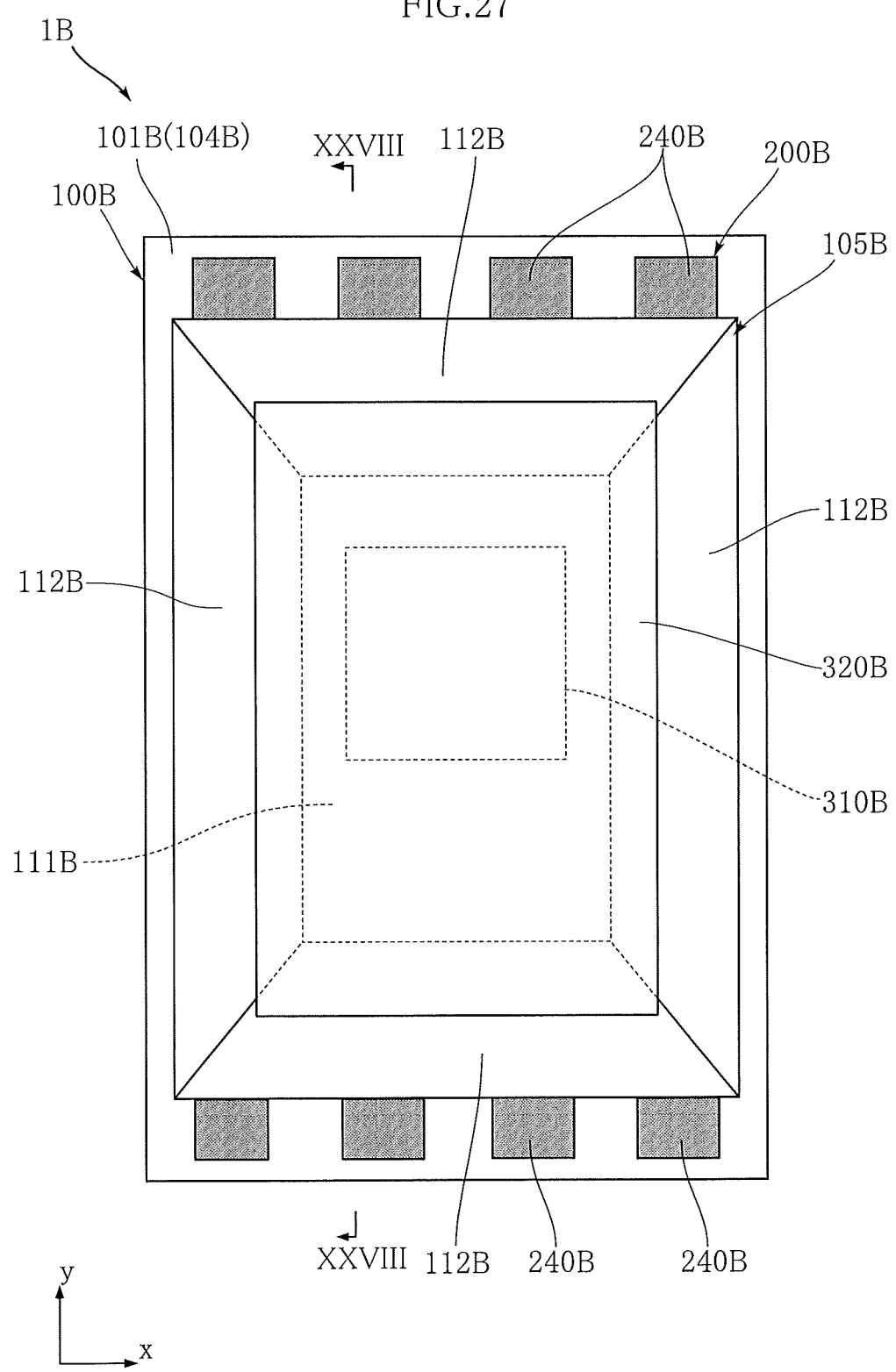
FIG. 27 is a plan view showing relevant parts of a semiconductor device based on a second embodiment of the present invention.
Figure 28:
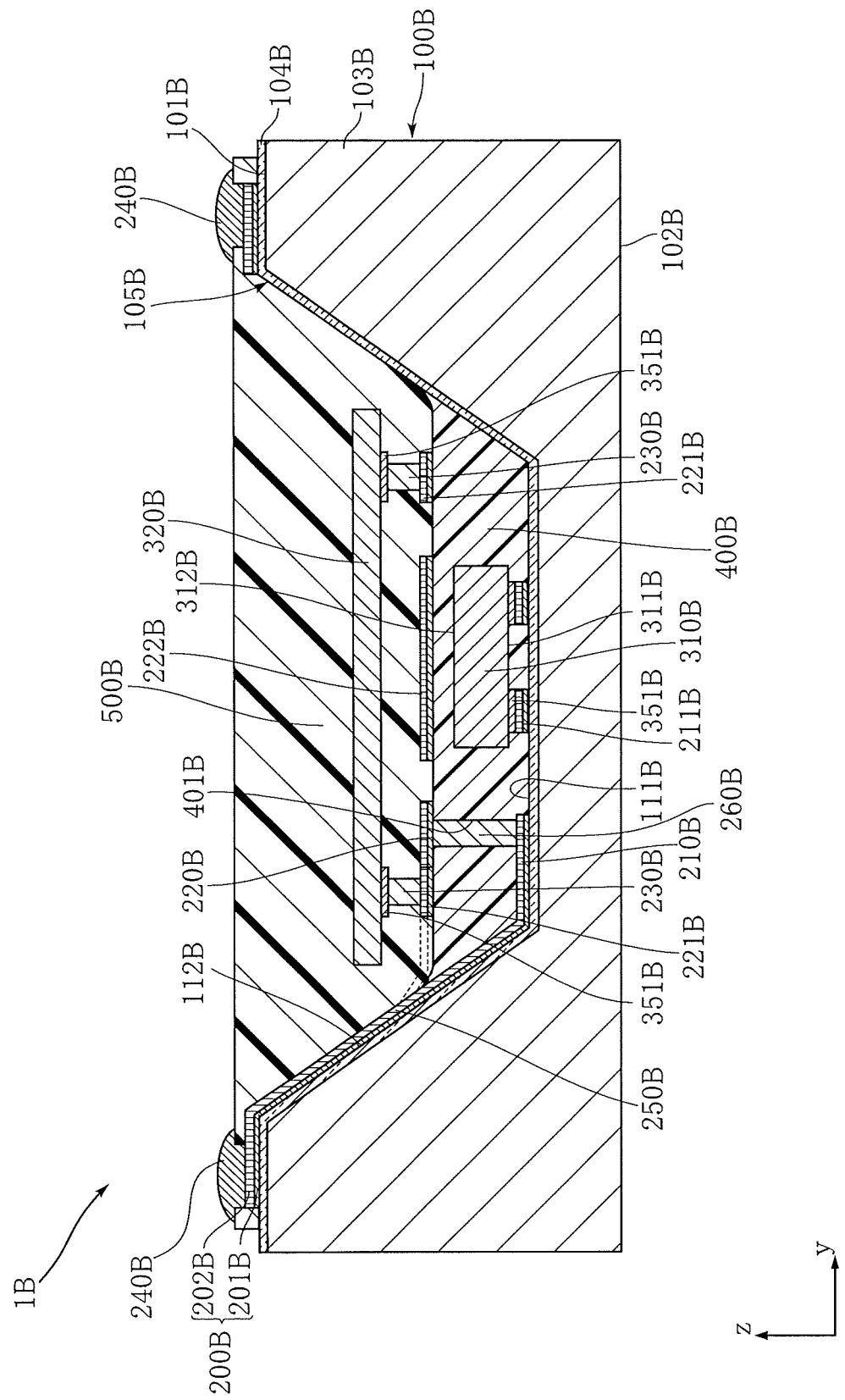
FIG. 28 is a cross-sectional view taken along line XXVIII-XXVIII in FIG. 27.

FIGS. 27 and 28 show a semiconductor device based on a second embodiment of the present invention. A semiconductor device 1B of the present embodiment includes a substrate 100B, a conducting portion 200B, a first circuit element 310B, a second circuit element 320B, an insulating film 400B, and sealing resin 500B. Note that in FIG. 27, to facilitate understanding, the sealing resin 500B is omitted. The semiconductor device 1B is configured as a wireless communication module, for example. As an example of the size of the semiconductor device 1B, the plan-view dimensions are about 1.5 mm×2.5 mm, and the thickness is about 0.6 mm.

The substrate 100B is to be the base of the semiconductor device 1B and is composed of a base material 103B and an insulating layer 104B. The substrate 100B has a main surface 101B, a back surface 102B, and a recessed portion 105B. The thickness of the substrate 100B is about 600 µm, for example. Note that in the present embodiment, the main surface 101B and the back surface 102B face mutually opposite sides in the z direction, and the z direction corresponds to the thickness direction of the semiconductor device 1B. Also, the x direction and the y direction are both orthogonal to the z direction.

The base material 103B is made of a single-crystal semiconductor material, and is made of single-crystal Si in the present embodiment. Also, the insulating layer 104B is made of $SiO_2$ in the present embodiment. Note that the material of the base material 103B is not limited to being Si and it is sufficient that the material can form the recessed portion 105B, which fulfills a later-described purpose. The insulating layer 104B covers a portion of the base material 103B that faces the side opposite to the back surface 102B. The thickness of the insulating layer 104B is about 0.1 to 1.0 µm, for example.

In the present embodiment, a (100) surface of the substrate 103B is used as the main surface 101B. The recessed portion 105B is recessed toward the back surface 102B from the main surface 101B. In the present embodiment, the recessed portion 105B has a bottom surface 111B and four inclined inner surfaces 112B. The shape of the recessed portion 105B depends on the fact that the (100) surface is used as the main surface 101B.

Due to the recessed portion 105B being formed, the main surface 101B has a rectangular ring shape in plan view. More specifically, the two sites on the main surface 101B that are located apart from each other in the y direction on opposite sides of the recessed portion 105B are significantly larger than the two sites on the main surface 101B that are located apart from each other in the x direction on opposite sides of the recessed portion 105B.

The recessed portion 105B has a rectangular shape in plan view. The depth of the recessed portion 105B is about 440 µm, for example. The bottom surface 111B has a rectangular shape in plan view. In plan view, the four inclined inner surfaces 112B surround the bottom surface 111B and have approximately trapezoidal shapes whose upper bases are in contact with the bottom surface 111B. The inclined inner surfaces 112B are inclined with respect to the bottom surface 111B. In the present embodiment, the angle of inclination with respect to the xy plane of the inclined inner surfaces 112B is about 55°. Note that the fact that the inclined inner surfaces 112B have an approximately trapezoidal shape and the inclination angle thereof is 55° depends on the fact that the (100) surface is used as the main surface 101B.

The conducting portion 200B is for mounting the first circuit element 310B and the second circuit element 320B and forming a current path for performing input to and output from the first circuit element 310B and the second circuit element 320B. The conducting portion 200B is formed mainly on the insulating layer 104B, and has a structure obtained by stacking a barrier seed layer 201B and a plating layer 202B in the present embodiment.

The barrier seed layer 201B is a so-called underlying layer for forming a desired plating layer 202B, and is formed mainly on the insulating layer 104B. The barrier seed layer 201B is composed of a Ti layer serving as, for example, a barrier layer formed on the insulating layer 104B, and a Cu layer serving as a seed layer stacked on the barrier layer. The barrier seed layer 201B is formed by sputtering, for example. In the present embodiment, the barrier seed layer 201B is formed at predetermined sites on the insulating layer 104B, the insulating film 400B, and the first circuit element 310B.

The plating layer 202B is made of Cu, for example, and is formed through electrolytic plating using the barrier seed layer 201B. The thickness of the plating layer 202B is about 5 μm, for example.

In the present embodiment, the conducting portion 200B has a first wiring layer 210B, a second wiring layer 220B, multiple column-like portions 230B, multiple external terminals 240B, a connection path 250B, and a connection route 260B.

The first wiring layer 210B is formed on the bottom surface 111B and has a predetermined pattern shape. The first wiring layer 210B has multiple bottom surface pads 211B. The multiple bottom surface pads 211B are used to mount the first circuit element 310B.

The second wiring layer 220B is located toward the main surface 101B with respect to the first wiring layer 210B in the normal direction (z direction) of the main surface 101B. The second wiring layer 220B is interposed between the insulating film 400B and the sealing resin 500B and has a predetermined pattern shape. In the present embodiment, the second wiring layer 220B is formed on the insulating film 400B. The second wiring layer 220B has multiple second element pads 221B and a shield layer 222B. The multiple second element pads 221B are used to mount the second circuit element 320B. The shield layer 222B is interposed between the first circuit element 310B and the second circuit element 320B and overlaps with the entirety of the first circuit element 310B as viewed in the normal direction (z direction) of the main surface 101B. The shield layer 222B is electrically connected to the connection path 250B, which will be described later, and is also electrically connected to the external terminal 240B for the ground terminal.

The column-like portions 230B extend in the depth direction of the recessed portion 105B, as shown in FIG. 28. In the present embodiment, the lower ends of the column-like portions 230B are connected to the second element pads 221B (second wiring layer 220B) and extend inside of the sealing resin 500B. The second circuit element 320B is mounted on the upper ends of the column-like portions 230B via solder 351B. The column-like portions 230B are made of Cu, for example, and are formed by electrolytic plating using the second element pads 221B.

The external terminals 240B are formed on the main surface 101B and are used to surface-mount the semiconductor device 1B on a circuit board of an electronic device (not shown), for example. In the present embodiment, four external terminals 240B are formed at each of two sites on the main surface 101B arranged apart from each other in the y direction, on opposite sides of the recessed portion 105B. Also, the external terminals 240B each have one side in contact with the outer edge of the recessed portion 105B. The external terminals 240B each have a structure in which a bump obtained by further performing non-electrolytic plating with a metal such as Ni, Pd, or Au, for example, on the above-described barrier seed layer 201B and the plating layer 202B is formed. Accordingly, as shown in FIG. 28, the external terminals 240B each have a shape that swells in the z direction.

The connection path 250B is formed on an inclined inner surface 112B and constitutes a path through which the external terminals 240B, and the first wiring layer 210B or second wiring layer 220B are electrically connected. Note that the position at which the connection path 250B is formed is determined as appropriate according to the arrangement of the external terminals 240B, the arrangement of the terminals of the first circuit element 310B and the second circuit element 320B, and the like. FIG. 28 shows a mode in which the connection path 250B is formed on the inclined inner surface 112B, but does not show the specific forming position. Also, in FIG. 27, the connection path 250B is omitted.

Note that in the present embodiment, the external terminal 240B located second from the left in the upper portion of FIG. 27 is used as the so-called ground terminal. The connection path 250B, which is electrically connected to this external terminal 240B, and the shield layer 222B are connected to ground.

The connection route 260B penetrates the insulating film 400B in the thickness direction (depth direction of the recessed portion 105B), as shown in FIG. 28. The connection route 260B electrically connects the first wiring layer 210B and the second wiring layer 220B, and is made of a metal filling a through-hole 401B provided at a suitable location on the insulating film 400B. The lower end of the connection route 260B is connected to the first wiring layer 210B, and the upper end of the connection route 260B is connected to the second wiring layer 220B. The connection route 260B is made of Cu, for example, and is formed through electrolytic plating using the first wiring layer 210B.

The first circuit element 310B is supported by the bottom surface 111B and is mounted via the solder 351B using the multiple bottom surface pads 211B. The first circuit element 310B is for controlling the second circuit element 320B, and is, for example, an integrated circuit element.

The insulating film 400B is formed on the bottom surface 111B and covers the first circuit element 310B and the first wiring layer 210B. In the present embodiment, the insulating film 400B covers the entirety of the first circuit element 310B. Examples of materials constituting the insulating film 400B include polyimide resin, epoxy nitride resin, phenol resin, polybenzoxazole (PBO) resin, and silicone resin. Also, the insulating film 400B may be formed as a silicon oxide film or a silicon nitride film using a CVD method. In the present embodiment, the through-hole 401B for the connection route 260B is formed at the time of forming the insulating film 400B. The through-hole 401B is formed using a method such as etching, for example.

The second circuit element 320B is an element for near-field wireless data communication conforming to the Bluetooth (registered trademark) standard, and is supported by the insulating film 400B via the multiple column-like portions 230B. The second circuit element 320B is mounted on the column-like portions 230B via the solder 351B.

The sealing resin 500B covers the second wiring layer 220B and the second circuit element 320B and fills the recessed portion 105B. In the present embodiment, the sealing resin 500B covers the entirety of the second wiring layer including the shield layer 222B, and the entirety of the second circuit element 320B. Examples of materials for the sealing resin 500B include epoxy resin, phenol resin, polyimide resin, polybenzoxazole (PBO) resin, and silicone resin. The sealing resin 500B may be either translucent resin or non-translucent resin, but in the present embodiment, non-translucent resin is preferable.

Next, effects of the semiconductor device 1B will be described.

According to the present embodiment, the first circuit element 310B and the second circuit element 320B are accommodated by being arranged in a stacked form in the recessed portion 105B of the substrate 100B made of a semiconductor material. For this reason, it is not necessary to provide leads for supporting the first circuit element 310B and the second circuit element 320B. In comparison to the case of molding the leads using a mold, it costs less to remake the shape of the substrate 100B made of the semiconductor material. Accordingly, the cost of the semiconductor device 1B can be reduced. In particular, in the case where a small number of the semiconductor devices 1B are produced, the cost-reduction effect is significant.

The conducting portion 200B includes the first wiring layer 210B formed on the bottom surface 111B of the recessed portion 105B, and the second wiring layer 220B that is located toward the main surface 101B with respect to the first wiring layer 210B in the normal direction (z direction) of the main surface 101B. With the configuration in which the first wiring layer 210B and the second wiring layer 220B are thus arranged in a stacked form in the z direction, a degree of freedom in the arrangement according to the positions of the terminals of the first circuit element 310B and the second circuit element 320B mounted on the first wiring layer 210B and the second wiring layer 220B is ensured. Accordingly, this configuration is suitable for achieving a smaller size of the semiconductor device 1B and causing multiple elements, namely the first circuit element 310B and second circuit element 320B accommodated in the recessed portion 105B to function appropriately.

The first wiring layer 210B formed on the bottom surface 111B is covered by the insulating film 400B, and the second wiring layer 220B is formed on the insulating film 400B. According to this, the insulating film 400B is interposed between the first wiring layer 210B and the second wiring layer 220B, whereby it is possible to suitably prevent a case in which the first wiring layer 210B and the second wiring layer 220B are inappropriately electrically connected.

The conducting portion 200B has the connection route 260B that is formed inside of the through-hole 401B of the insulating film 400B and connects to the first wiring layer 210B and the second wiring layer 220B. With this kind of configuration, it is possible to connect suitable locations of the first wiring layer 210B and the second wiring layer 220B, which is suitable for raising the degree of freedom in the arrangement.

The second wiring layer 220B has the shield layer 222B interposed between the first circuit element 310B and the second circuit element 320B, and the shield layer 222B overlaps with the entirety of the first circuit element 310B as viewed in the normal direction (z direction) of the main surface 101B. When mounting the semiconductor device 1B, the shield layer 222B is connected to ground via the connection path 250B and the external terminals 240B. The first circuit element 310B covered by the second circuit element 320B, which is a wireless communication element, is easily influenced by radio waves. In the present embodiment, by equipping the shield layer 222B with the above-described configuration, it is possible to prevent the influence of radio waves and prevent malfunction of the first circuit element 310B.

Due to the substrate 100B being made of a single-crystal semiconductor material represented by Si, the inclined inner surface 112B can be finished as a surface that is accurately inclined by a known predetermined angle with respect to the bottom surface 111B. In particular, due to the substrate 100B being made of Si and a (100) surface being used as the main surface 101B, the angles of the four inclined inner surfaces 112B with respect to the bottom surface 111B can all be set to around 55°. Accordingly, the semiconductor device 1B can be given a well-balanced shape configuration.

The insulating film 400B is formed on the bottom surface 111B in the recessed portion 105B so as to cover the first circuit element 310B. Due to the first circuit element 310B being mounted on the bottom surface 111B and the second circuit element 320B being mounted on the insulating film 400B, the first circuit element 310B and the second circuit element 320B can be arranged three-dimensionally at different locations in the z direction. Accordingly, it is possible to achieve both a smaller size and improved function of the semiconductor device 1B.

The semiconductor device according to the present invention is not limited to the foregoing embodiments. The specific configuration of the semiconductor device according to the present invention can be designed and modified in various ways.

In the embodiments above, a case was described in which the conducting portion 200A (200B) has a two-layer structure in which the first wiring layer 210A (210B) and the second wiring layer 220A (220B) are formed in the recessed portion 105A (105B) and are at different positions in the depth direction of the recessed portion 105A (105B). However, a layer structure may be used in which there are three or more wiring layers formed in the recessed portion.

The invention claimed is:
1. A semiconductor device, comprising:
a substrate having a main surface and formed with a recessed portion in the main surface, the substrate being made of a semiconductor material;
a conducting portion formed on the substrate; and
a sealing resin disposed in the recessed portion;
wherein the conducting portion includes a first wiring layer and a second wiring layer both formed in the recessed portion, the second wiring layer being closer to the main surface than is the first wiring layer in a normal direction of the main surface,
wherein the recessed portion includes: an inclined inner surface inclined with respect to the main surface; and a bottom surface connected to the inclined inner surface,
wherein the first wiring layer is formed on the bottom surface,
wherein the semiconductor device comprises an insulating film covering the bottom surface,
wherein the second wiring layer is disposed between the insulating film and the sealing resin, and
wherein the insulating film is formed with a through-hole penetrating in a thickness direction of the insulating film, and the conducting portion includes an electro-conductive connection route that is formed in the through-hole and connected to both the first wiring layer and the second wiring layer.

2. The semiconductor device according to claim 1, further comprising a first circuit element disposed in the recessed portion.

3. The semiconductor device according to claim 2, wherein the first circuit element is supported by the bottom surface.

4. The semiconductor device according to claim 3, wherein the insulating film covers at least a part of the first circuit element.

5. The semiconductor device according to claim 4, further comprising a second circuit element that overlaps with at least a part of the first circuit element as viewed in the normal direction of the main surface.

6. The semiconductor device according to claim 5, wherein the first circuit element includes: a first surface facing the bottom surface; and a second surface opposite to the first surface, the second surface being not covered by the insulating film, and the second wiring layer includes a shield layer that covers an entirety of the second surface.

7. The semiconductor device according to claim 6, wherein the insulating film includes: a flat surface parallel to the bottom surface; and an inclined surface closer to the first circuit element than is the flat surface, and the shield layer spans across the second surface and the inclined surface.

8. The semiconductor device according to claim 6, wherein the conducting portion includes a plurality of column-like portions for mounting the second circuit element, and each of the column-like portions has an end portion connected to the second wiring layer and extends in a depth direction of the recessed portion.

9. The semiconductor device according to claim 6, wherein the conducting portion includes a plurality of external terminals formed on the main surface, and the shield layer is connected to one external terminal among the plurality of external terminals, the one external terminal being connected to ground.

10. The semiconductor device according to claim 4, wherein the first circuit element includes a first surface facing the bottom surface and a second surface opposite to the first surface, the second surface being not covered by the insulating film, and wherein the second wiring layer spans across the second surface and the insulating film.

11. The semiconductor device according to claim 10, wherein the insulating film includes: a flat surface parallel to the bottom surface; and an inclined surface closer to the first circuit element than is the flat surface, and the second wiring layer spans across the second surface and the inclined surface.

12. The semiconductor device according to claim 4, wherein the insulating film covers an entirety of the first circuit element.

13. The semiconductor device according to claim 5, wherein the second wiring layer includes a plurality of second element pads for mounting the second circuit element.

14. The semiconductor device according to claim 5, wherein the insulating film covers an entirety of the first circuit element, and the second wiring layer includes a shield layer that is located between the first circuit element and the second circuit element, and that overlaps with an entirety of the first circuit element as viewed in the normal direction of the main surface.

15. The semiconductor device according to claim 14, wherein the conducting portion includes a plurality of external terminals formed on the main surface, and the shield layer is connected to one external terminal among the plurality of external terminals, the one external terminal being connected to ground.

16. The semiconductor device according to claim 5, wherein the second circuit element is a wireless communication element.

17. The semiconductor device according to claim 1, wherein the substrate is made of a single-crystal semiconductor material.

18. The semiconductor device according to claim 17, wherein the semiconductor material is Si.

19. The semiconductor device according to claim 18, wherein the main surface is a (100) surface, and the recessed portion has four inclined inner surfaces each being inclined with respect to the main surface.

* * * * *